US006911295B2

(12) United States Patent
Kawamura et al.

(10) Patent No.: US 6,911,295 B2
(45) Date of Patent: Jun. 28, 2005

(54) PLANOGRAPHIC PRINTING PLATE PRECURSOR

(75) Inventors: Koichi Kawamura, Shizuoka-ken (JP); Miki Takahashi, Shizuoka-ken (JP); Sumiaki Yamasaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/207,016

(22) Filed: Jul. 30, 2002

(65) Prior Publication Data

US 2003/0079636 A1 May 1, 2003

(30) Foreign Application Priority Data

Aug. 3, 2001 (JP) ....................................... 2001-236923
Aug. 6, 2001 (JP) ....................................... 2001-237565

(51) Int. Cl.[7] .................................................... G03F 7/11

(52) U.S. Cl. ................................ 430/270.1; 430/271.1; 430/278.1; 430/302; 430/306; 430/348; 430/434; 430/944; 430/945; 430/964; 101/453; 101/454; 101/456; 101/463.1

(58) Field of Search ........................... 430/270.1, 271.1, 430/278.1, 302, 306, 348, 434, 944, 945, 964; 101/453, 454, 456, 463.1

(56) References Cited

U.S. PATENT DOCUMENTS 5,900,345 A * 5/1999 Platzer et al. ............... 430/156
6,566,029 B2 * 5/2003 Kawamura et al. ......... 430/138
6,607,866 B1 * 8/2003 Kawamura et al. ...... 430/270.1
2002/0023565 A1 * 2/2002 Kawamura et al. ......... 101/453
2002/0142247 A1 * 10/2002 Kawamura et al. ...... 430/270.1

FOREIGN PATENT DOCUMENTS

| | | |
|---|---|---|
| EP | 0709228 A1 | 5/1996 |
| EP | 0 823 327 A2 | 2/1998 |
| EP | 1 075 942 A2 | 2/2001 |
| EP | 1 088 679 A2 | 4/2001 |
| EP | 1 172 696 A1 | 1/2002 |
| EP | 1 211 096 A1 | 6/2002 |
| JP | 59-101651 | 6/1984 |
| JP | 7-1853 | 1/1995 |
| JP | 8-507727 | 8/1996 |
| JP | 8-272087 | 10/1996 |
| JP | 8-292558 | 11/1996 |

* cited by examiner

*Primary Examiner*—Barbara L. Gilliam
(74) *Attorney, Agent, or Firm*—Sughrue Mion, PLLC

(57) ABSTRACT

The positive planographic printing plate precursor of the present invention is a precursor comprising (I) a positive recording layer including a water-insoluble and alkali-soluble polymer compound and a light to heat converting agent, on a support having a hydrophilic surface in which a hydrophilic graft polymer chain is present. The precursor may further comprise (II) a lower layer including a water-insoluble and alkali-soluble polymer compound between the recording layer and the support.

9 Claims, No Drawings

PLANOGRAPHIC PRINTING PLATE PRECURSOR

BACKGROUND OF THE INVENTION

1. Field of the Invention

The present invention relates to a planographic printing plate precursor, and particularly, to a positive planographic printing plate precursor for so-called direct plate making that is capable of making a plate directly from digital signals of a computer and the like.

2. Description of the Related Art

Planographic printing is a printing method using a plate material having a lipophilic region that receives ink and an ink repellent region (hydrophilic region) that does not receive ink but receives dampening water. Recently, planographic printing plate precursors having photosensitivity (PS plates) are being widely used.

PS plates obtained by disposing a photosensitive layer on a support made of an aluminum plate or the like are being made practical, and are widely used. Printing is performed using these PS plates by removing the photosensitive layer at a non-image portion by image exposure and development, and using a hydrophilicity of a surface of a support and a lipophilicity of the photosensitive layer at an image portion. In the PS plate, being removable without generating a residual film is required of the non-image portion, while, excellent close adherence of the recording layer to the support without easily peeling is required of the image-portion. Further, in the non-image portion, the hydrophilic surface of the support is exposed after the removal of the recording layer by the development. However, when the surface of the support does not have a sufficient hydrophilicity, staining occurs in produced prints due to an adhesion of ink to the surface. Therefore, the surface of the support is required to have a high hydrophilicity from the standpoint of preventing the staining at the non-image portions.

Conventionally, as the hydrophilic support or the hydrophilic layer used by a planographic printing plate, generally an anodized aluminum support is used, or to further enhance hydrophilicity, a support obtained by silicate-treating this anodized aluminum support is used. Further, there are many studies on the hydrophilic layers and the hydrophilic supports that use these aluminum supports. For example, Japanese Patent Application Laid-Open (JP-A) No. 7-1853 discloses a substrate treated with an undercoating agent composed of polyvinylphosphonic acid, and JP-A No. 59-101651 discloses a technique of using a polymer having a sulfonate group as an undercoating layer for the photosensitive layer. Further, a technique of using a polyvinylbenzoic acid or the like as an undercoating agent has also been proposed.

On the other hand, various techniques have been proposed relating to a hydrophilic layer which is utilized when a flexible support (substrate) such as PET (polyethylene terephthalate), cellulose acetate and the like is used instead of a metal support such as the aluminum support. Examples thereof include a swelling hydrophilic layer composed of a hydrophilic polymer and a hydrophobic polymer disclosed in JP-A No. 8-292558, a PET support having a micro-porous hydrophilic cross-linked silicate surface disclosed in EP No. 0,709,228, a hydrophilic layer which is hardened with a hydrolyzed tetraalkyl orthosilicate and contains a hydrophilic polymer described in JP-A Nos. 8-272087 and 8-507727, and the like.

These hydrophilic layers have enhanced hydrophilicity of the plate as compared with conventional plates and provide a planographic printing plate that obtains a print having no stains at the beginning of printing. However, these hydrophilic layers have problems wherein peeling is occurs during repeated printing and a decrease in hydrophilicity occurs with the passage of time. Therefore, there is a desire for a planographic printing plate precursor that obtains large number of prints having no stain, having a hydrophilic layer that does not peel from the substrate and in which the hydrophilicity of the surface does not decrease even under more severe printing conditions. From the standpoint of practicality, further improvement in hydrophilicity thereof is also required.

Development of lasers has been remarkable in recent years, and particularly, solid lasers and semiconductor lasers, which emit a light in a range of from near infrared to infrared wavelengths, have a high output and are portable, are easily available. As a light source for exposure for making a plate directly based on digital data of a computer or the like, these lasers are very useful.

In the recording layer of the positive type planographic printing plate precursor for use with an infrared laser, an alkali aqueous solution-soluble binder resin and a light to heat converting agent, such as an infrared absorbing dye and the like, which absorbs light and generates heat are contained as essential components. The light to heat converting agent acts as a dissolution inhibitor substantially decreasing the solubility of the binder resin by a mutual action with the binder resin in non-exposed parts (image portions). In exposed parts (non-image portions), the mutual action of the light to heat converting with the binder resin weakens by the generated heat, and causes the photosensitive layer to dissolve in an alkali developer. In this way, a planographic printing plate is formed.

However, though energy necessary for an image forming reaction is obtained on an irradiated surface of the precursor when it is exposed by the laser, the image forming property of a recording layer has a problem wherein thermal diffusion from the recording layer into a support is remarkable, particularly when a general-purpose aluminum support having an excellent heat conductivity is used as the support, and energy applied is not sufficiently utilized for image formation and sensitivity of the photosensitive layer is low.

SUMMARY OF THE INVENTION

An object of the present invention is to provide a positive planographic printing plate precursor having excellent image formation sensitivity, giving an improved printing stain resistance and capable of forming a high quality image and having no stains.

The present inventors have studied to achieve the above-mentioned object, and thus have found that the problems can be solved by preparing a support having a hydrophilic surface showing high hydrophilicity and providing an excellent duration, and forming a positive recording layer on the support to complete a first aspect of the invention.

Namely, first aspect of the present invention is a positive planographic printing plate precursor comprising a support including a substrate and a hydrophilic surface, and a positive recording layer disposed on said support. Said positive recording layer includes a light to heat converting agent, and a water-insoluble and alkali-soluble polymer compound. Said hydrophilic surface includes a hydrophilic graft polymer chain and a solubility of said positive recording layer in an alkali aqueous solution is increased by exposure.

Though the action of the first aspect of the invention is not entirely clear, it is supposed that, when a positive recording layer in an exposed region is speedily removed by an alkaline developer after exposure, excellent hydrophilicity due to a hydrophilic surface having a hydrophilic graft polymer chain showing high mobility will be discovered in the exposed region, and therefore the providing and draining speed of wetting water provided at the time of printing can be increased, and staining of non-image portions can be effectively suppressed by its excellent hydrophilicity.

Further, as a result of earnest studies, the present inventors have found that the above-mentioned object can be achieved by forming a recording layer by laminating a heat sensitive layer, which includes a light to heat converting agent, on a lower layer, which includes a water-insoluble and alkali-soluble polymer compound, and disposing this recording layer on a support, which has a hydrophilic layer including a hydrophilic graft polymer chain. Thus, the second embodiment of the invention was completed.

Namely, second aspect of the present invention is a positive planographic printing plate precursor comprising a support including a substrate and a hydrophilic surface, and a recording layer disposed on said support and formed by providing a heat sensitive layer on a lower layer. The hydrophilic surface includes a hydrophilic graft polymer. Preferably, the hydrophilic graft polymer is directly bonded to the surface of the substrate. The lower layer includes a water-insoluble and alkali-soluble polymer compound. The heat sensitive layer includes a water-insoluble and alkali-soluble polymer compound and a light to heat converting agent, and a solubility of said heat sensitive layer in an alkali aqueous solution is increased by an effect of at least one of light and heat.

In the second aspect of the present invention, it is preferable that the polymer compound contained in the heat sensitive layer has a phenolic hydroxyl group, and the polymer compound contained in the lower layer is an acrylic resin.

Though the action of the second aspect of the present invention is not entirely clear, it is thought to be as follows. In the planographic printing plate precursor of the present invention, the hydrophilic surface comprising a hydrophilic graft polymer chain is disposed on the substrate, and the lower layer containing an alkali-soluble polymer compound is provided adjacent to the hydrophilic. It is thought that the lower layer and the hydrophilic surface function as heat insulating layers to effectively suppress thermal diffusion into the support. Moreover, it is believed that high sensitivity is obtained since the heat sensitive layer containing a light to heat converting agent is provided near or as a surface to be exposed or heated, and therefore energy imparted is used efficiently for image formation.

Further, after exposure, when the heat sensitive layer, which is provided as an upper portion, is removed in the exposed region, a lower layer excellent in alkali-solubility is exposed. The recording layer in the exposed region is removed together with the lower layer speedily by an alkali developer without generation of an undesired residue film and the like. As a result, excellent hydrophilicity is achieved in the exposed region by the hydrophilic surface having a hydrophilic graft polymer chain showing high mobility. In the non-exposed region, since the heat sensitive layer having a excellent function of suppressing dissolution into an alkali developer functions as a dissolution suppressing layer, the strength of image portions (non-exposed regions) is not impaired. Accordingly, it is thought that an image of excellent image quality having no staining on non-image portions can be formed.

Third aspect of the present invention is a method for producing a positive planographic printing plate precursor. The method comprises the steps of disposing a hydrophilic surface, in which a hydrophilic graft polymer chain is present, on a substrate to form a support, and providing a recording layer, which includes a substance for absorbing light and generating heat and a water-insoluble and alkali-soluble polymer compound, and wherein solubility in an alkaline aqueous solution of the recording layer increases, by the effect of at least one of light and heat.

DESCRIPTION OF THE PREFERRED EMBODIMENTS

The positive planographic printing plate precursors according to the first and second aspects of the present invention will be described in detail below.

The positive planographic printing plate precursor according to the first aspect of the present invention is characterized in that a positive recording layer is disposed on a support, which positive recording layer contains a substance that absorbs light and generates heat and a water-insoluble and alkali-soluble polymer compound. A solubility of the recording layer in an alkali aqueous solution increases by exposure, and the support has a hydrophilic surface comprising a hydrophilic graft polymer chain. The positive planographic printing plate precursor according to the second aspect of the present invention is characterized by having a positive recording layer of a two-layer structure, which layer comprises a heat sensitive layer and a lower layer, disposed on a support having a hydrophilic surface comprising a hydrophilic graft polymer chain.

First, the support having the hydrophilic surface comprising the hydrophilic graft polymer chain, which support is used in the planographic printing plate precursors according to the first and second aspects of the present invention will be described below.

Support Having a Hydrophilic Surface Comprising a Hydrophilic Graft Polymer Chain

Hydrophilic Surface Comprising a Hydrophilic Graft Polymer Chain

The hydrophilic surface of the support used in the present invention indicates the surface in which the hydrophilic graft polymer chain is present. The hydrophilic graft polymer chain may be directly bonded to the surface of the substrate, or the hydrophilic polymer may be provided by disposing an intermediate layer, which can bond with the graft polymer, on the surface of the substrate, and grafting the hydrophilic polymer on top of the intermediate layer. Further, examples of the hydrophilic surface in the present invention include following embodiments. In one embodiment, a polymer obtained by bonding a hydrophilic graft polymer chain to a trunk polymer compound as a principal chain, or a polymer obtained by bonding a hydrophilic graft polymer chain to a trunk polymer compound and further introducing thereto a cross-linkable functional group, is prepared and placed on the surface of the substrate by application or application and cross-linking. In another embodiment, a composition containing a hydrophilic polymer having a cross-linking group on a terminal end of the polymer and a cross-linking agent is prepared and placed on the surface of a substrate by application or application and cross-linking.

The hydrophilic polymer used in the present invention is characterized in that the polymer has a structure in which at least one end of the polymer is bonded to the surface of the substrate or the surface layer of the substrate and a graft portion of the polymer, which shows hydrophilicity, is substantially not cross-linked. That is, the hydrophilicity due to hydrophilic portions of the polymer remains even after the supports are prepared. This structure has a characteristic of being able to keep a high mobility without restricting the mobility of a polymer portion providing hydrophilicity and without burying the polymer portion in a strong cross-linked structure. It is supposed that, due to the above reason, an excellent hydrophilicity is achieved as compared with a hydrophilic polymer having a usual cross-linked structure.

The hydrophilic graft polymer chain used in the present invention has a molecular weight (Mw) within the range of from 500 to 5,000,000, preferably from 1,000 to 1,000,000, more preferably from 2,000 to 500,000.

In the present invention, a hydrophilic graft polymer chain bonded to the surface of a substrate directly or bonded onto an intermediate layer disposed on the surface of a substrate, can be referred to as a "surface graft". When a hydrophilic graft polymer chain is introduced into a polymer cross-linked film structure, the term "hydrophilic graft chain-introduced cross-linked hydrophilic layer" will be used to refer to this layer. Further, a substrate or a material obtained by providing an intermediate layer on a substrate may be called a "substrate" or a "base material" in the present invention. Furthermore, a "support" can mean a combination of a substrate and a hydrophilic layer or a hydrophilic surface, which comprises the hydrophilic graft polymer and is provided on the substrate, and a "substrate" can mean a substrate which does not combines with a hydrophilic layer or a hydrophilic surface for convenience.

Method of Producing Surface Graft

As a method of producing a surface having a hydrophilic group and comprising the graft polymer on a substrate, there are two methods: a method in which the substrate and the graft polymer are adhered by a chemical bond; and a method in which a compound having a polymerizable double bond is polymerized with the substrate as a base point to provide the graft polymer.

First, the method in which the substrate and the graft polymer are adhered by the chemical bond will be described. In this method, a polymer having, at the terminal-end or side chain thereof, a functional group, which is reactable with the substrate, is used. Grafting can be caused by chemically reacting this functional group with a functional group on the surface of a substrate. The functional group reacting with the substrate is not particularly limited in so far as it can react with the functional group on the surface of the substrate. Examples thereof include silane coupling groups such as alkoxy silane, isocyanate group, amino group, hydroxyl group, carboxyl group, sulfonate group, phosphate group, epoxy group, allyl group, methacryloyl group and acryloyl group. Examples of compounds that are particularly useful as the polymer having a reactive functional group at the terminal-end or side chain thereof include a hydrophilic polymer having a trialkoxysilyl group at the polymer end, a hydrophilic polymer having an amino group at the polymer end, a hydrophilic polymer having a carboxyl group at the polymer end, a hydrophilic polymer having an epoxy group at the polymer end and a hydrophilic polymer having an isocyanate group at the polymer end.

The hydrophilic polymer herein used is not particularly limited in so far as it is a hydrophilic polymer. Specific examples thereof include polyacrylic acid, polymethacrylic acid, polystyrenesulfonic acid, poly-2-acrylamide-2-methylpropane sulfonic acid and salts thereof, polyacrylamide and polyvinylacetamide. Additionally, polymers obtained from hydrophilic monomers used in the following surface graft polymerization, or copolymers containing the hydrophilic monomers can also be used advantageously.

The method in which a compound having a polymerizable double bond is polymerized to a substrate as a base point in order to provide a graft polymer is generally called a surface graft polymerization. The surface graft polymerization method indicates a method in which the compound having the polymerizable double bond is provided so as to be in contact with the substrate and an active species is imparted on the surface of a substrate by a method such as plasma irradiation, light irradiation, heating and the like, thus bonding to the substrate by polymerization.

As the surface graft polymerization method for realizing the present invention, any known methods described in documents can be used. Examples thereof include a photopolymerization method and a plasma irradiating graft polymerization method described as the surface graft polymerization method in the Society of Polymer Science ed., "Shin Koubunshi jikkengaku" (No. 10) ("New Polymer Experiment 10"), Kyouritsu Shuppan Co., Ltd., 1994, p. 135. Further, irradiating graft polymerization methods using radiations such as $\gamma$ ray, electron beam and the like are described in Takeuchi ed., "Kyuuchaku gijutsu Binran" ("Adsorption Technical Handbook"), NTS Corporation, February, 1999, p. 203 and p. 695. As the specific method of the photo-graftpolymerization, usable methods are described in JP-A Nos. 63-92658, 10-296895 and 11-119413. For the plasma irradiating graft polymerization method, and radiation irradiating graft polymerization method, methods described in the above-mentioned literatures and Y. Ikeda et al., "Macromolecules", Vol. 19, (1986) page 1804 and the like.

Specifically, the surface of a polymer such as PET and the like is treated with plasma or electron beam to generate a radial on the surface, then, this active surface and a monomer having a hydrophilic functional group may be reacted to obtain the graft polymer surface layer, namely, the surface layer having a hydrophilic group.

The photo-graftpolymerization can also be carried out by applying a photopolymerizable composition to the surface of a film substrate, then, allowing the composition to contact an aqueous radical polymerization compound and irradiating it with light as described in JP-A No. 53-17497 (Kansai Paint Co., Ltd.) and JP-A No. 2000-212313 (Dainippon Ink & Chemicals, Inc.), in addition to the above-mentioned literatures.

Compound Having Polymerizable Double Bond Useful for Surface Graft Polymerization The compound useful for forming a hydrophilic graft polymer chain must contain a polymerizable double bond and also have a hydrophilic property. As the compound, any of hydrophilic polymers, aqueous oligomers or hydrophilic monomers can be used if they have a double bond in the molecule. Particularly useful are hydrophilic monomers. Examples of the hydrophilic monomer useful in the present invention, monomers having positive charge such as ammonium, phosphonium and the like, and monomers having an acidic group which has a negative charge or which can be dissociated to have a negative charge such as a sulfonic acid group, carboxyl group, phosphoric acid group, phosphoric acid group and the like or an, are listed and may be used. Additionally, for example, hydrophilic monomers having a nonionic group such as a hydroxyl group, amide group, sulfonamide group, alkoxy group, cyano group and the like can also be used.

Specific examples of the particularly useful hydrophilic monomer in the present invention include (meth)acrylic acid and alkali metal salts and amine salts thereof, itaconic acid and alkali metal salts and amine salts thereof, allylamine and hydrohalides thereof, 3-vinylpropionic acid and alkali metal salts and amine salts thereof, vinylsulfonic acid and alkali metal salts and amine salts thereof, styrenesulfonic acid and alkali metal salts and amine salts thereof, 2-sulfoethylene (meth)acrylate and 3-sulfopropylene (meth)acrylate and alkali metal salts and amine salts thereof, 2-acrylamide-2-methylpropanesulfonic acid and alkali metal salts and amine salts thereof, acid phosphooxypolyoxyethylene glycol mono (meth)acrylate and salts thereof, 2-dimethylaminoethyl (meth)acrylate and hydrohalogenates thereof, 3-trimethylammoniumpropyl (meth)acrylate, 3-trimethylammoniumpropyl (meth)acrylamide and a N,N,N-trimethyl-N-(2-hydroxy-3-methacryloyloxypropyl) ammonium chloride. Further, 2-hydroxyethyl (meth) acrylate, (meth)acrylamide, N-monomethylol(meth) acrylamide, a N-dimethylol(meth)acrylamide, a N-vinylpyrrolidone, N-vinylacetamide, polyoxyethylene glycol mono(meth)acrylate and the like are also useful.

Method of Producing Hydrophilic Graft Chain-introduced Cross-linked Hydrophilic Layer The cross-linked hydrophilic layer having an hydrophilic graft chain introduced thereto, which is used in the present invention, can be generally produced by producing a graft polymer using a known method and cross-linking the resulted graft polymer. Specifically, synthesis of graft polymers are described in Fumio Ide "Gurafuto juugou to sono ouyou" ("Grafting Copolymerization and Application thereof"), Koubunshi Kankou Kai, 1977, and The Society of Polymer Science ed., "Shin Koubunshi jikkengaku No. 2, Koubunshi no gousei, Hannou" ("New Polymer Experiment 2, Synthesis and Reaction of Polymer"), Kyoritsu Shuppan Co., Ltd. (1995).

Synthesis of a graft polymer is basically classified into three methods: (1). polymerizing a branch monomer from a trunk polymer, (2). bonding a branch polymer to a trunk polymer, (3). copolymerizing a branch polymer to a trunk polymer (macromer method). The hydrophilic surface used in the present invention can be produced by using any of these three methods, but (3) the macromer method is particularly excellent from the standpoint of production suitability and control of a film structure. Synthesis of a graft polymer using a macromer is described in the above-mentioned the Society of Polymer Science ed., "Shin koubunshi jikkengaku No. 2, koubunshi no gousei, Hannou" ("New Polymer Experiment 2, Synthesis and Reaction of Polymer"), Kyouritsu Shuppan Co., Ltd. (1995). It is also described in detail in, Yuta Yamashita "Makuromonomaa no kagaku to kougyou" ("Chemistry and Industry of Macromonomer"), IPC, 1989.

Specifically, the hydrophilic macromer can be synthesized according to the general methods described in the documents by using the hydrophilic monomers specifically described above as the monomer used in the above-mentioned organic cross-linked hydrophilic layer, such as acrylic acid, acrylamide, 2-acrylamide-2-methylpropanesulfonic acid, N-vinylacetamide and the like.

Examples of particularly useful macromers among hydrophilic macromers usable in the present invention include macromers derived from monomers containing a carboxyl group such as acrylic acid, methacrylic acid and the like, sulfonic acid-based macromers derived from monomers of 2-acrylamide-2-methylpropanesulfonic acid, vinylstyrene-sulfonic acid and salts thereof, amide-based macromers such as acrylamide, methacrylamide and the like, amide-based macromers derived from N-vinylcarboxylic amides monomer such as N-vinylacetamide, N-vinylformamide and the like, macromers derived from hydroxyl group-containing monomers such as hydroxyethyl methacrylate, hydroxyethyl acrylate, glycerol monomethacrylate and the like, and macromers derived from alkoxy group- or ethylene oxide group-containing monomers such as methoxyethyl acrylate, methoxypolyethylene glycol acrylate, polyethylene glycol acrylate and the like. Also, monomers having a polyethylene glycol chain or polypropylene glycol chain can be used as the macromer in the present invention.

The useful molecular weight of these macromers is from 400 to 100,000, preferably from 1,000 to 50,000, and particularly preferably from 1,500 to 20,000. When the molecular weight is 400 or less, an effects of the invention cannot be shown, and when the molecular weight is 100,000 or more, an ability to polymerize with copolymerization monomers which are forming the main chain deteriorates.

In one method of producing a cross-linked hydrophilic layer which has a cross linked structure and has an hydrophilic graft chain introduced thereto, these hydrophilic macromers are synthesized. The hydrophilic macromer is copolymerized with another of the aforementioned monomers having a reactive functional group to synthesize a graft-copolymerized polymer. Then, the synthesized graft copolymerized polymer and a cross-linking agent, which reacts with the reactive functional group of the polymer, are applied on a substrate, and they are reacted by heat to be cross-linked. As another method, a method is mentioned in which a hydrophilic macromer and a graft polymer having a photo-crosslinkable group or polymerizable group is synthesized, and this is applied on a substrate and reacted to be cross-linked by irradiation with light.

Thus, the hydrophilic surface comprising the hydrophilic graft polymer chain can be provided on the substrate as a base material. The thickness of a layer forming the hydrophilic surface can be selected depending on the object. Generally, this thickness is preferably from 0.001 μm to 10 μm, more preferably from 0.01 μm to 5 μm, and most preferably from 0.1 μm to 2 μm. When the film thickness is too small, scratch resistance tends to decrease, and when the film thickness is too large, an ink repelling property tends to decrease.

When the substrate surface has high hydrophilicity, it is not necessary that a graft polymer cover the surface of the substrate completely. When a graft polymer is introduced into the surface of a known hydrophilic substrate, an effective hydrophilicity improvement is obtained if a graft polymer is introduced in a proportion of 0.1% or more based on the whole area of the surface. More preferably, the proportion of a graft polymer is 1% or more, and even more preferably 10% or more based on the whole area of the surface.

Substrate

The substrate used for forming the hydrophilic surface comprising the hydrophilic graft polymer of the present invention is not particularly restricted. Any substrate can be used as long as it is a dimensionally stable material in the form of a plate and has a necessary flexibility, strength, durability and the like. Examples thereof include papers, papers laminated with plastics (for example, papers laminated with polyethylene terephthalate, polyethylene naphthalate, polyethylene, polypropylene, polystyrene and the like), metal plates (for example, aluminum, zinc, copper and the like), plastic films (for example, cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate, polyvinylacetal and the like) and papers or plastic films laminated or vapor-deposited with the metals described above. As the substrate used in the present invention, polyester film and aluminum plate are preferable. Further, plastic films laminated or vapor-deposited with aluminum are also preferable. A suitable aluminum plate is a pure aluminum plate or an alloy plate comprising aluminum as a main component and containing a trace amount of extraneous elements. Examples of the extraneous element contained in the aluminum alloy include silicon, iron, manganese, copper, magnesium, chromium, zinc, bismuth, nickel and titanium. The content of extraneous elements in an alloy is preferably 10% by weight or less. A particularly suitable aluminum in the present invention is pure aluminum, however, since completely pure aluminum is not easily produced from the standpoint of a refining technology, it may also contain extraneous elements in slight amount.

The aluminum plate thus applied to the present invention is not restricted in its composition, and aluminum plates made of materials which are publicly known and used can be appropriately utilized. The thickness of the aluminum plate used in the present invention is from about 0.1 mm to 0.6 mm, preferably from 0.15 mm to 0.4 mm, and particularly preferably from 0.2 mm to 0.3 mm.

Surface Condition of Substrate

As the substrate used for forming the hydrophilic surface comprising the graft polymer, a substrate in which a surface to be hydrophilicated has been roughened before a hydrophilic treatment are preferably used, from the standpoint of improvement in hydrophilicity of the hydrophilic surface or close adherence with an image formation layer provide thereon. Examples of the preferable surface conditions of the surface of the substrate (solid surface) used in the present invention will be described below.

The surface properties of the surface-roughened substrate preferably satisfy the following requirements.

The preferred condition of the surface-roughened substrate is indicated by two-dimensional roughness parameters which are as follows. Preferably, the substrate satisfies at least one, and more preferably all of the requirements of the two-dimensional roughness parameters: the center line mean roughness (Ra) is from 0.1 to 1 $\mu$m; the maximum height (Ry) is from 1 to 10 $\mu$m; the ten-points mean roughness (Rz) is from 1 to 10 $\mu$m; the concave-to-convex mean distance (Sm) is from 5 to 80 $\mu$m; the convex-to-convex mean distance measured in the predetermine range(S) is from 5 to 80 $\mu$m; the maximum height (2) (Rt) is from 1 to 10 $\mu$m; the center line convex height (Rp) is from 1 to 10 $\mu$m; and the center line concave depth (Rv) is from 1 to 10 $\mu$m.

The two-dimensional roughness parameters are defined as follows:

Centerline Mean Roughness (Ra)

A length L is measured in a direction of a centerline from a roughness curve. Absolute values of the variation of length from the roughness curve to the centerline are arithmetically averaged. The arithmetic average indicates the centerline mean roughness (Ra).

Maximum Height (Ry)

A predetermined length is determined in a direction of an average of the roughness curve, and within this length, the distance between a convex (crest) line and a concave (trough) line is measured in a direction of the longitudinal magnification of the roughness curve. This distance indicates the maximum height (Ry).

Ten-point Mean Roughness (Rz)

A predetermined length is determined in the direction of the average of the roughness curve. Within this length, each height of the first through fifth highest convex portions, and each depth of the first through fifth lowest concave portions are measured in the direction of the longitudinal magnification of the mean line. The average value (Yp) of the absolute values of the height of the first to fifth highest convex portion, and the average (Yv) of the absolute values of the depth of the first to fifth deepest concave portion are summed up. The sum of the two average values indicates the ten-point mean roughness (Rz) in units of micrometer ($\mu$m).

Concave-to-convex Mean Distance (Sm)

A predetermined length is determined in the direction of the average of the roughness curve. Within this length, each length of the mean line between one convex portion and the concave portion adjacent to the convex portion is measured and summed up. An obtained value is arithmetically averaged. The arithmetic average indicates the convex-to-concave mean distance (Sm) in units of micrometer ($\mu$m).

Convex-to-convex Mean Distance Measured in the Predetermine Range (S)

A predetermined length is determined in the direction of the average of the roughness curve. Within this length, each length of a mean line between adjacent convex portions (crests) is measured. All the lengths thus measured are arithmetically averaged. The arithmetic average value indicates the convex-to-convex mean distance (S) in units of micrometer ($\mu$m).

Maximum Height (2) (Rt)

A predetermined length is determined in the direction of the average of the roughness curve. Within this length, the centerline in the determined length is disposed between two straight lines that are both parallel to the centerline, and the distance between the two straight lines is measured. This distance expresses the maximum height (2) (Rt).

Center Line Convex Height (Rp)

A length L is measured in the direction of the centerline from a roughness curve. Within the length, a straight line tangent to the highest convex peak and parallel to the centerline is drawn, and the distance between the straight line and the centerline is measured. This indicates the center line convex height (Rp).

Center Line Concave Depth (Rv)

A length L is measured in the direction of the centerline from a roughness curve. Within the length, a straight line tangent to the deepest concave bottom and parallel to the centerline is drawn, and the distance between the straight line and the centerline is measured. This value indicates the center line valley depth (Rv).

(Positive Recording Layer)

The positive recording layer of the positive planographic printing plate precursor of the first aspect of the present invention is characterized in that it contains a substance absorbing light and generating heat and a water-insoluble and alkali-soluble polymer, and the layer shows an increase in solubility in an alkaline aqueous solution by exposure. The planographic printing plate precursor of the second aspect of the present invention is characterized in that it has a recording layer obtained by sequentially laminating a lower layer and a heat sensitive layer on a support. The lower layer contains a polymer compound which is water-insoluble and alkali-soluble and the heat sensitive layer contains a light to heat converting agent and a water-insoluble and alkali-soluble polymer compound which shows an increase in solubility into an alkaline aqueous solution by the action of light or heat.

The polymer compound which is water-insoluble and alkali-soluble contained in the recording layer will be illustrated below.

Polymer Compound Which is Water-insoluble and Alkali-soluble

The water-insoluble and alkali-soluble polymer compound which can be used in the positive recording layer, the heat sensitive layer and the lower layer in the present invention (hereinafter, sometimes referred to as alkali-soluble polymer) includes homopolymers containing an acidic group in the main chain and/or side chain in the polymer, copolymers thereof and mixtures thereof. Therefore, the recording layer according to the present invention has a property showing dissolution when it is in contact with an alkaline developer.

As the alkali-soluble polymer used in the positive recording layer used in the present invention, conventionally known polymers can be used without specific restrictions. Among conventionally known polymers, those polymers which have an acidic group listed in the following (1) to (6) in the main chain and/or side chain thereof are preferable from the standpoint of solubility in an alkaline developer.

(1) Phenolic hydroxyl group (—Ar—OH)

(2) Sulfoneamide group ($—SO_2NH—R$)

(3) Substituted sulfoneamide-based acid group (hereinafter, referred to as "active imide group") [$—SO_2NHCOR$, $—SO_2NHSO_2R$, $—CONHSO_2R$]

(4) Carboxylic acid group ($—CO_2H$)

(5) Sulfonic acid group ($—SO_3H$)

(6) Phosphoric acid group ($—OPO_3H_2$)

In the above-mentioned (1) to (6), Ar represents a divalent aryl connecting group optionally having a substituent, and R represents a hydrocarbon group optionally having a substituent.

Of alkaline water-soluble polymers having an acidic group of the above-mentioned (1) to (6), alkaline water-soluble polymers having at least one of (1) a phenolic group, (2) a sulfoneamide group and (3) an active imide group are preferable, and particularly, alkaline water-soluble polymers having at least one of (1) a phenolic group and (2) a sulfoneamide group in at least one of a main chain and a side chain of the polymer are most preferable from the standpoint of securing sufficient solubility in an alkaline developer, developing latitude and film strength.

Next, typical examples of the polymerization components of these alkaline water-soluble polymer compounds will be described.

As the polymerizable monomer having a phenolic hydroxyl group (1), polymerizable monomers composed of a lower molecular weight compound having one or more phenolic hydroxyl groups and one or more polymeriable unsaturated bonds are listed. Examples thereof include acrylamide, methacrylamide, acrylates, methacrylates, hydroxystyrene and the like having a phenolic hydroxyl group.

Specific examples thereof include N-(2-hydroxyphenyl) acrylamide, N-(3-hydroxyphenyl)acrylamide, N-(4-hydroxyphenyl)acrylamide, N-(2-hydroxyphenyl) methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, 2-(4-hydroxyphenyl)ethyl methacrylate and the like. These monomers having a phenolic hydroxyl group may be used singly or in combination of two or more.

Further, as the alkali-soluble polymer having a phenol group, examples thereof include novolak resins such as a condensate of phenol and formaldehyde, condensate of m-cresol and formaldehyde, condensate of p-cresol and formaldehyde, condensate of m-/p-mixed cresol and formaldehyde, condensate of phenol, cresol (may be any of m-, p- and m-/p-mixed) and formaldehyde, and a condensate of pyrogallol and acetone. Further, copolymers obtained by copolymerizing a compound having a phenol group in the side chain are also listed. Alternatively, copolymers obtained by copolymerizing a compound having a phenol group in the side chain can also be used.

As the polymerizable monomers having a sulfoneamide group (2), polymerizable monomers which are a lower molecular weight compounds having in one molecule one or more sulfoneamide groups ($—NH—SO_2—$) in which at least one hydrogen atom is bonded to a nitrogen atom, and one or more polymerizable unsaturated bonds are listed. For example, lower molecular weight compounds having an acryloyl group, allyl group or vinyloxy group, and substituted of mono-substituted aminosulfonyl group or substituted sulfonylimino group are preferable. Examples of these compounds include compounds of the following general formulae (I) to (V) described in JP-A No. 8-123029.

General formula I

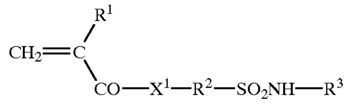

General formula II

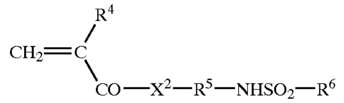

General formula III

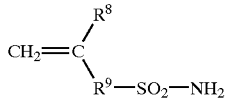

General formula IV

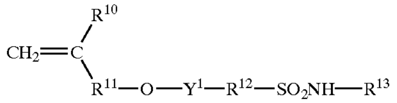

General formula V

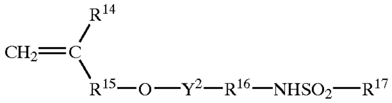

In the formulae, each of $X^1$ and $X^2$ independently represents —O— or $—NR^7$. Each of $R^1$ and $R^4$ independently represents a hydrogen atom or $—CH_3$. Each of $R^2$, $R^5$, $R^9$, $R^{12}$ and $R^{16}$ independently represents an alkylene group having 1 to 12 carbon atoms, cycloalkylene group, arylene group or aralkylene group, optionally having a substituent. Each of $R^3$, $R^7$ and $R^{13}$ independently represents a hydrogen atom, an alkyl group having 1 to 12 carbon atoms, a cycloalkyl group, an aryl group or an aralkyl group, which may have a substituent. Each of $R^6$ and $R^{17}$ independently represents an alkyl group having 1 to 12 carbon atoms, a cycloalkyl group, an aryl group or an aralkyl group, which may have a substituent. Each of $R^8$, $R^{10}$ and $R^{14}$ independently represents a hydrogen atom or $—CH_3$. Each of $R^{11}$ and $R^{15}$ independently represents a single bond or an alkylene group having 1 to 12 carbon atoms, a cycloalkylene group, an arylene group or an aralkylene group, which may have a substituent. $Y^1$ and $Y^2$ each independently represent a single bond or CO.

Specifically, among compounds of the general formulae (i) to (v), m-aminosulfonylphenyl methacrylate, N-(p-aminosulfonylphenyl)methacrylamide, N-(p-aminosulfonylphenyl)acrylamide and the like can be suitably used.

Examples of the alkali-soluble polymer having a sulfoneamide group include polymers which are constituted from a minimum constituent unit derived from the above-mentioned compound having a sulfoneamide group, as the main constituent component.

As the polymerizable monomer having an active imide group (3), those having an active imide group in the molecule described in JP-A No. 11-84657 are preferable. Examples thereof include polymerizable monomers which are lower molecular weight compounds having in one molecule one or more active imide groups and one or more polymerizable unsaturated bonds are listed.

Examples of the compound described above include compounds having in the molecule one or more active imide groups of the following structural formula and

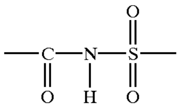

one or more polymerizable unsaturated groups.

Specifically, N-(p-toluenesulfonyl)methacrylamide, N-(p-toluenesulfonyl)acrylamide and the like can be suitably used. Examples of the alkali-soluble polymer having an active imide group include polymers which are constituted from a minimum constituent unit derived from a compound having an active imide group as the main constituent component.

(4) Examples of the alkali-soluble polymer having a carboxyl group include polymers which are constituted from a minimum constituent unit derived from a compound having in the molecule one or more carboxyl groups and one or more polymerizable unsaturated groups as the main constituent component.

(5) Examples of the alkali-soluble polymer having a sulfonic acid group include polymers which are constituted from a minimum constituent unit derived from a compound having in the molecule one or more sulfonate groups and one or more polymerizable unsaturated groups as the main constituent component.

(6) Examples of the alkali-soluble polymer having a phosphoric acid group include polymers which are constituted from a minimum constituent unit derived from a compound having in the molecule one or more phosphoric acid groups and one or more polymerizable unsaturated groups as the main constituent component.

The minimum constituent unit, which has an acidic group selected from the above-mentioned (1) to (6), and constitutes the alkali-soluble polymer used in the positive recording layer of the planographic printing plate precursor of the present invention, is not particularly required to be used alone. Two or more kinds of minimum constituent units having the same acidic group or two or more kinds of minimum constituent units having different acidic groups can be copolymerized and used for the present invention.

As the copolymerization method, a conventionally known graft copolymerization method, a block copolymerization method, a random copolymerization method and the like can be used.

In the case when the above-mentioned copolymer is used, the compound having an acidic group selected from (1) to (6) to be copolymerized is contained in a copolymer preferably in an amount of 10 mol % or more, and more preferably 20 mol % or more. When this amount is less than 10 mol %, alkali-solubility tends to be insufficient and an effect of improving developing latitude may not be achieved sufficiently.

Examples of a monomer component to be copolymerized with the compound having an acidic group selected from the above-mentioned (1) to (6) include, but are not limited to, compounds listed in the following compounds (m1) to (m12).

(m1) Acrylates and methacrylates having an aliphatic hydroxyl group such as 2-hydroxyethyl acrylate or 2-hydroxyethyl methacrylate and the like (m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and the like (m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and the like (m4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like (m5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like (m6) Vinyl esters such as vinyl acetate, vinyl chloroacetate, vinyl butyrate, vinyl benzoate and the like (m7) Styrenes such as styrene, α-methylstyrene, methylstyrene, chloromethylstyrene and the like (m8) Vinyl ketones such as methyl vinyl ketone, ethyl vinyl ketone, propyl vinyl ketone, phenyl vinyl ketone and the like (m9) Olefins such as ethylene, propylene, isobutylene, butadiene, isoprene and the like (m10) N-vinylpyrrolidone, acrylonitrile, methacrylonitrile and the like (m11) Unsaturated imides such as maleimide, N-acryloylacrylamide, N-acetylmethacrylamide, N-propionylmethacrylamide, N-(p-chlorobenzoyl) methacrylamide and the like (m12) Unsaturated carboxylic acids such as acrylic acid, methacrylic acid, maleic anhydride, itaconic acid and the like The alkali-soluble polymer preferably has a phenolic hydroxyl group in order to have an excellent image forming property in exposure by an infrared laser and the like. Preferable examples thereof include novolak resins such as a phenol formaldehyde resin, m-cresol formaldehyde resin, p-cresol formaldehyde resin, m-/p-mixed cresol formaldehyde resin, phenol/cresol (may be any of m-, p-, m-/p-mixed) mixed formaldehyde resin, and the like, and a pyrogallol acetone resin.

Examples of the alkaline water-soluble polymer compound having a phenolic hydroxyl group further include polycondensates of formaldehyde and phenol having an alkyl group having 3 to 8 carbon atoms as a substituent such as a t-butylphenol formaldehyde resin and a octylphenyl formaldehyde resin as described in U.S. Pat. No. 4,123,279.

As the method of copolymerizing the alkaline water-soluble polymer compound, conventionally known graft copolymerization method, block copolymerization method, random copolymerization method and the like can be used.

When the alkali-soluble polymer is the above-mentioned homopolymer or copolymer of the polymerizable monomer having a phenolic hydroxyl group, the polymerizable monomer having a sulfoneamide group or the polymerizable monomer having an active imide group in the present invention, those having a weight-average molecular weight of 2,000 or more and a number-average molecular weight of 500 or more are preferable. Further preferable polymers are those having a weight-average molecular weight of from 5,000 to 300,000, a number-average molecular weight of from 800 to 250,000 and a degree of dispersion (weight-average molecular weight/number-average molecular weight) of from 1.1 to 10.

When the alkali-soluble polymer is a phenol formadehyde resin, cresol aldehyde resin or the like, those having a weight-average molecular weight of from 500 to 20,000 and a number-average molecular weight of from 200 to 10,000 are preferable.

In the case of the second aspect, as the alkali-soluble polymer used in the lower layer, acrylic resins are preferable from the standpoint of image formation in development, since they can suitably maintain the solubility of the lower layer in an alkali developer which comprises a base and an organic compound having an buffering function, as the main components. Further, as this acrylic resin, those having sulfoamide group are particularly preferable.

As the alkali-soluble polymer used in a heat sensitive layer, polymer compounds having a phenolic hydroxyl group are desirable since they have strong hydrogen bonding property in non-exposed parts and they cause partial release of hydrogen bonds easily in exposed parts, and they provide a large difference in developing property between non-exposed parts and exposed parts into a non-silicate developer, and therefore improvement in image formation property is obtained. A further preferable polymer is a novolak resin.

The above-mentioned alkali-soluble polymers may be used alone or in combinations of two or more. They are used in an amount of from 30 to 99% by weight, preferably from 40 to 95% by weight, and particularly preferably from 50 to 90% by weight based on the total solid content of the abovementioned heat sensitive layer. When the amount of the alkali-soluble polymer is less than 30% by weight, the durability of a heat sensitive layer deteriorates, and when the amount is over 99% by weight, neither sensitivity nor durability is preferable.

Material Absorbing Light and Generating Heat

As the materials absorbing light and generating heat used in the first and second aspect of the present invention (hereinafter, referred to as light to heat converting agent), those substances, which absorb an irradiated beam of light energy used for recording and generating heat, can be used without particular restriction of an absorption wavelength range thereof. Preferable substances are infrared absorbing dyes or pigments having an absorption maximum in the wavelength range of from 760 nm to 1200 nm from the standpoint of applicability to readily available high output lasers.

As the dye used as the light to heat converting agent in the present invention, commercially available dyes and known dyes described in literatures such as The Society of Synthetic Organic Chemistry ed., "Senryo Binran" ("Dye Handbook"), 1970 and the like can be used. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts, metal thiolate complexes, oxonol dyes, diimmonium dyes and aminium dyes, and chroconium dyes.

Preferable examples of the dyes include cyanine dyes described in JP-A Nos. 58-125246, 59-84356, 59-202829, 60-78787 and the like, methine dyes described in JP-A Nos. 58-173696, 58-181690, 58-194595 and the like, naphthoquinone dyes described in JP-A Nos. 58-112793, 58-224793, 59-48187, 59-73996, 60-52940, 60-63744 and the like, squalirium dyes described in JP-A No. 58-112792 and the like, and cyanine dyes described in U.K. Patent No. 434,875, and the like.

Further, near infrared ray absorbing sensitizers described in U.S. Pat. No. 5,156,938 are also used suitably, and substituted arylbenzo(thio)pyrylium salts described in U.S. Pat. No. 3,881,924, trimethinethiapyrylium salts described in JP-A No. 57-142645 (U.S. Pat. No. 4,327,169), pyrylium-based compounds described in JP-A Nos. 58-181051, 58-220143, 59-41363, 59-84248, 59-84249, 59-146063and 59-146061, cyanine dyes described in JP-A No. 59-216146, pentamethinethiopyrylium salts and the like described in U.S. Pat. No. 4,283,475, and pyrylium compounds disclosed in Japanese Patent Application Publication (JP-B) Nos. 5-13514 and 5-19702 are also preferably used.

Examples of other suitable examples of the dyes include near infrared absorbing dyes represented by the formulae (I) and (II) in U.S. Pat. No. 4,756,993.

Particularly preferable dyes among these dyes are cyanine dyes, phthalocyanine dyes, oxonol dyes, squalirium dyes, pyrylium salts, thiopyrylium dyes and nickel thiolate complexes. Further, dyes of the following general formulae (a) to (e) are preferable due to their excellent light to heat converting efficiency, and particularly, cyanine dyes represented by the following general formula (a) are most preferable since, when used in the polymerizable composition used in the present invention, they give a high polymerization activity and have excellent stability and economical efficiency.

General formula (a)

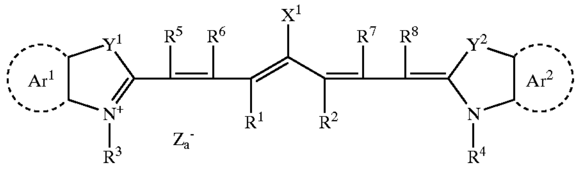

In the general formula (a), $X^1$ represents a hydrogen atom, halogen atom, —$NPh_2$, $X^2$-$L^1$ or a group shown below. Here, $X^2$ represents an oxygen atom or sulfur atom, and $L^1$ represents a hydrocarbon group having 1 to 12 carbon atoms, an aromatic ring having a hetero atom, or a hydrocarbon group having 1 to 12 carbon atoms and containing a hetero atom. Here, the hetero atom represents N, S, O, halogen atom or Se.

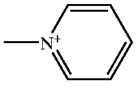

Each of $R^1$ and $R^2$ independently represents a hydrocarbon group having 1 to 12 carbon atoms. From the standpoint of the storage stability of an application solution for a recording layer, $R^1$ and $R^2$ preferably represent a hydrocarbon group having 2 or more carbon atoms. Further, it is particularly preferable that $R^1$ and $R^2$ are mutually bonded to form a 5-membered or 6-membered ring.

$Ar^1$ and $Ar^2$ may be the same or different, and represent an aromatic hydrocarbon group optionally having a substituent. As the preferable aromatic hydrocarbon group, a benzene ring and a naphthalene ring are listed. Examples of the preferable substituent include hydrocarbon groups having 12 or less carbon atoms, halogen atoms, and alkoxy groups having 12 or less carbon atoms. $Y^1$ and $Y^2$ may be the same or different, and represent a sulfur atom or a dialkylmethylene group having 12 or less carbon atoms. $R^3$ and $R^4$ may be the same or different, and represent a hydrocarbon group having 20 or less carbon atoms and optionally having a substituent. Examples of the preferable substituent include sulfo group, carboxyl group and alkoxy groups having 1 to 12 carbon atoms. $R^5$, $R^6$, $R^7$ and $R^8$ may be the same or different and represent a hydrogen atom or a hydrocarbon group having 1 to 12 carbon atoms. From the standpoint of availability of raw materials, a hydrogen atom is preferable. $Za^-$ represents a counter anion. However, when any of $R^1$ to $R^8$ is substituted by a sulfo group, $Za^-$ is not necessary. Preferable examples of $Za^-$ include halogen ions, perchloric acid ion, tetrafluoroborate ion, hexafluorophosphate ion and sulfonic acid ion. Further, the perchloric acid ion, hexafluorophosphate ion and arylsulfonic acid ion are particularly preferable as $Za^-$, from the standpoint of the storage stability of a recording layer application solution.

Specific examples of the cyanine dye of the general formula (a) which can be suitably used in the present invention include those described in Japanese Patent Application No. 11-310623, paragraph nos. 17 to 19, Japanese Patent Application No. 2000-224031, paragraph nos. 12 to 38 and Japanese Patent Application No. 2000-211147, paragraph nos. 12 to 23, in addition to those examples given below.

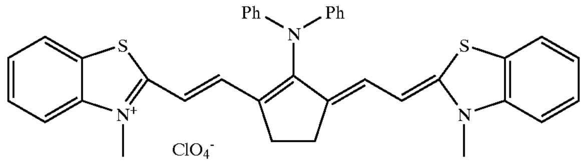

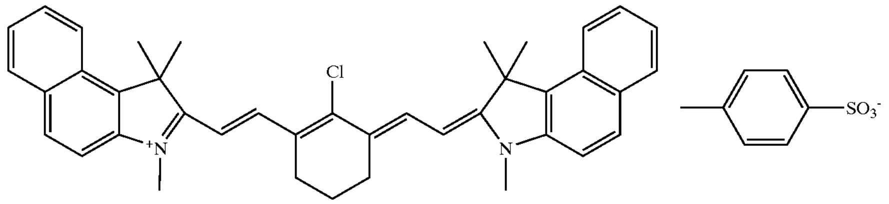

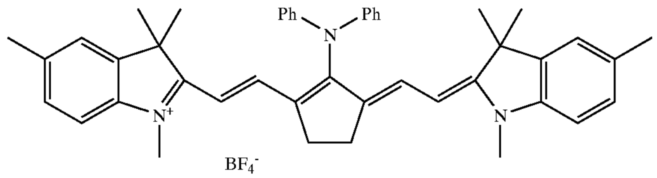

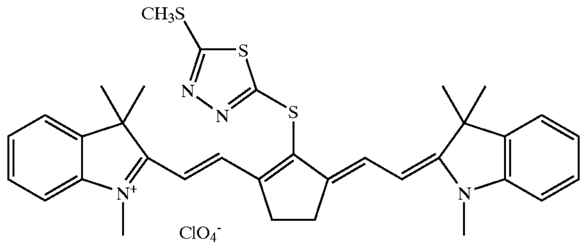

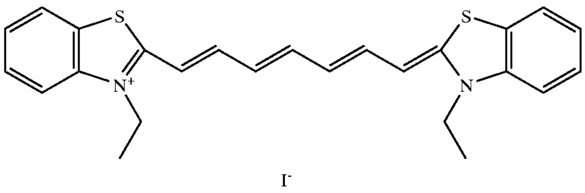

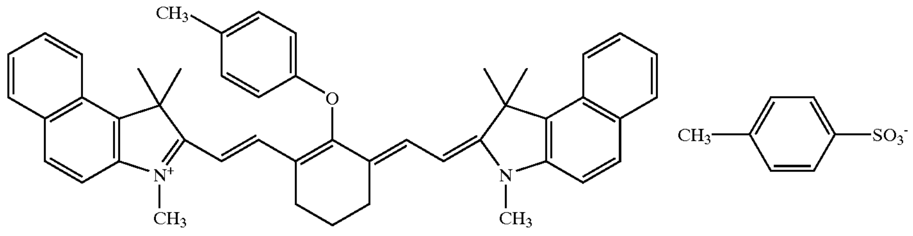

-continued
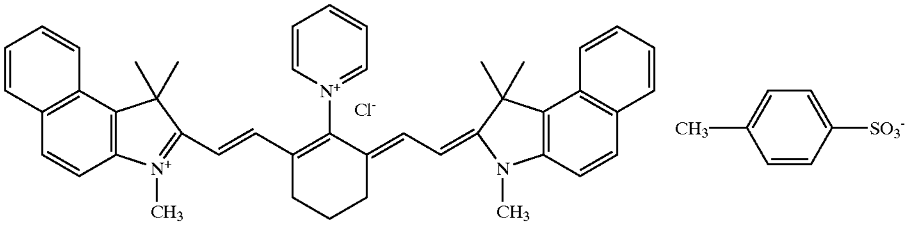
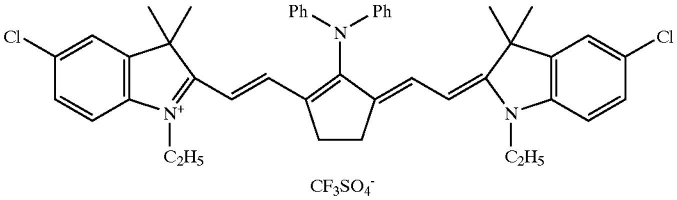
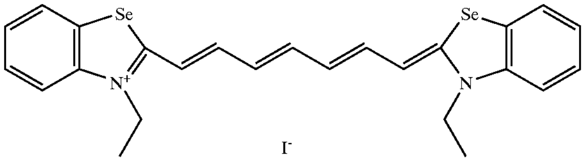
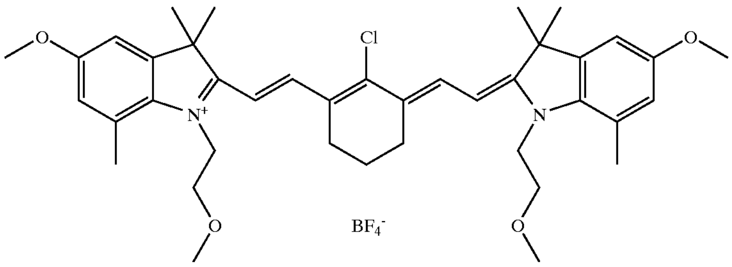
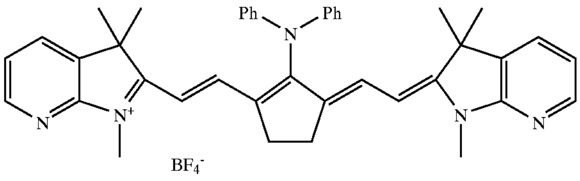
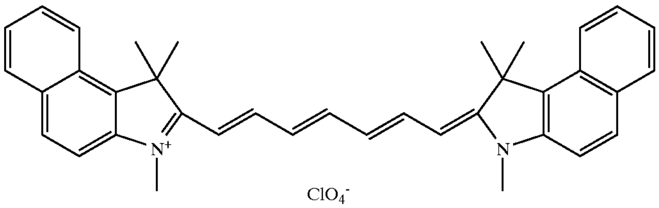
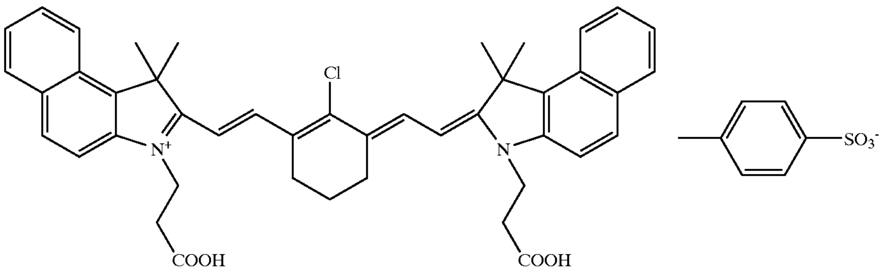

-continued

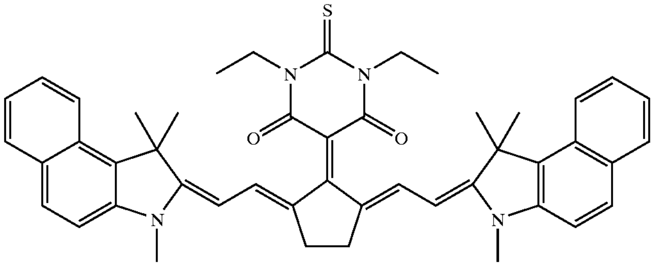

General formula (b)

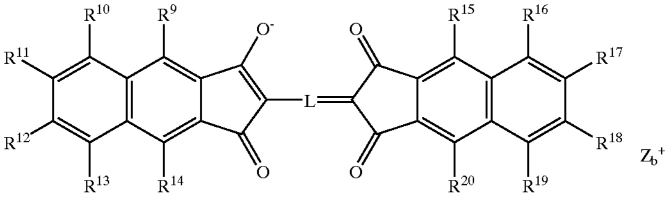

In the above-mentioned general formula (b), L represents a methine chain having 7 or more conjugated carbon atoms, and this methine chain may have at least one of substituent and the substituents may be mutually bonded to form a cyclic structure. $Zb^+$ represents a counter ion. Examples of the preferable counter cation include ammonium, iodonium, sulfonium, phosphonium, pyrydinium, and alkali metal cations ($Ni^+$, $K^+$, $Li^+$). $R^9$ to $R^{14}$ and $R^{15}$ to $R^{20}$ each independently represents a hydrogen atom or substituent selected from halogen atoms, cyano group, alkyl groups, aryl groups, alkenyl groups, alkynyl groups, carbonyl group, thio group, sulfonyl group, sulfinyl group, oxy group and amino groups, or a substituent combining two or three of these groups. The substituent may have a cyclic structure wherein the above groups are mutually bonded. Here, a compound of the above-mentioned general formula (b) in which L represents a methine chain having seven conjugated carbon atoms, and all of $R^9$ to $R^{14}$ and $R^{15}$ to $R^{20}$ represent a hydrogen atom are preferable from the standpoints of easy availability and effect thereof.

Examples of the specific examples of the dyes of the general formula (b), which can be suitably used in the present invention, include those exemplified below.

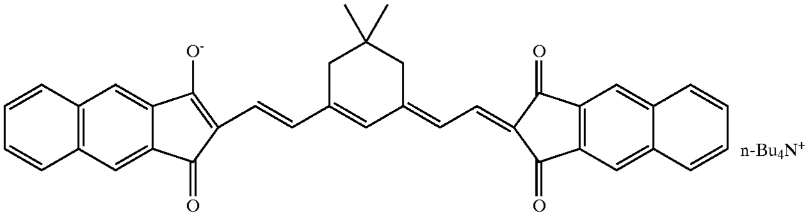

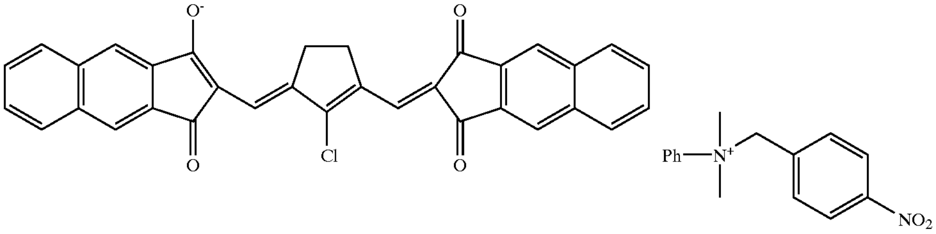

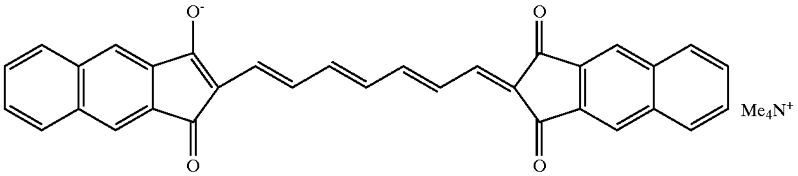

-continued

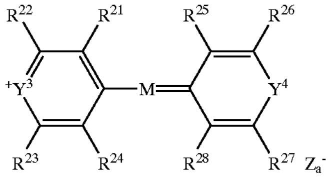

General formula (c)

In the above-mentioned general formula (c), each of $Y^3$ and $Y^4$ represents an oxygen atom, sulfur atom, selenium atom or tellurium atom. M represents a methine chain having 5 or more conjugated carbon atoms. $R^{21}$ to $R^{24}$ and $R^{25}$ to $R^{28}$ may be the same or different, and each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. In the formula, $Za^-$ represents a counter anion, and has the same meaning as for $Za^-$ in the above-mentioned general formula (a).

Specific examples of the dyes of the general formula (c) which can be suitably used in the present invention include those given below.

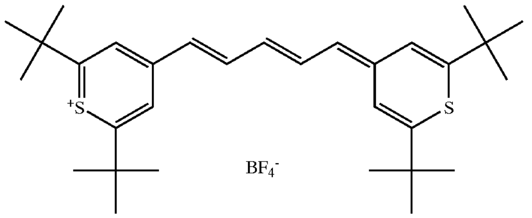

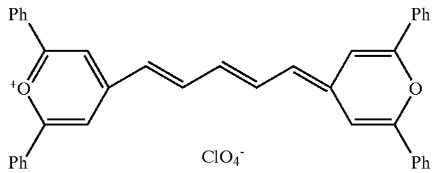

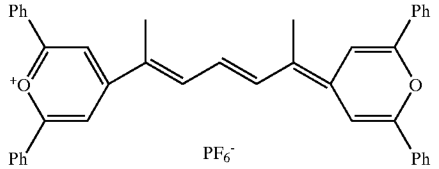

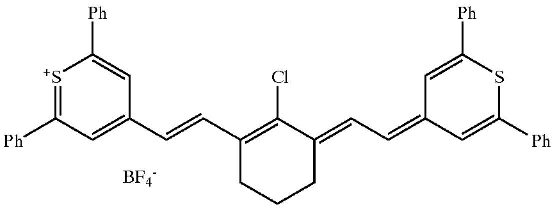

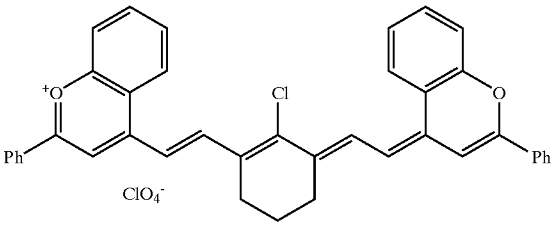

-continued

General formula (d)

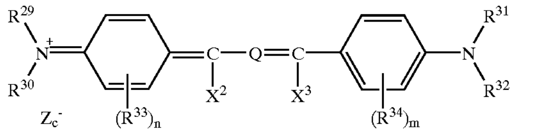

In the above-mentioned general formula (d), each of $R^{29}$ to $R^{31}$ independently represents a hydrogen atom, an alkyl group or an aryl group. $R^{33}$ and $R^{34}$ each independently represents an alkyl group, a substituted oxy group or a halogen atom. n and m each independently represents an integer of 0 to 4. $R^{29}$ and $R^{31}$ or $R^{31}$ and $R^{32}$ may be mutually bonded to form a ring, and $R^{29}$ and/or $R^{30}$ may be bonded to $R^{33}$ and $R^{31}$ and/or $R^{32}$ may be bonded to $R^{34}$ to form a ring. Further, when a plurality of $R^{33}$s and/or $R^{34}$s are present, the $R^{33}$s may be mutually bonded or the $R^{34}$s may be mutually bonded to form a ring. $X^2$ and $X^3$ each independently represents a hydrogen atom, an alkyl group or an aryl group, and at least one of $X^2$ and $X^3$ represents an alkyl group. Q represents a trimethine group or pentamethine group optionally having a substituent, and may form a cyclic structure together with a divalent organic group. $Zc^-$ represents a counter anion, and has the same meaning as for $Za^-$ in the above-mentioned general formula (a).

Specific examples of the dyes of the general formula (d) which can be suitably used in the present invention include those listed below.

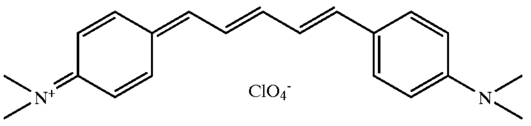

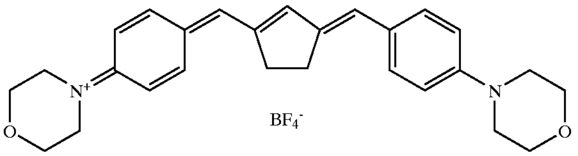

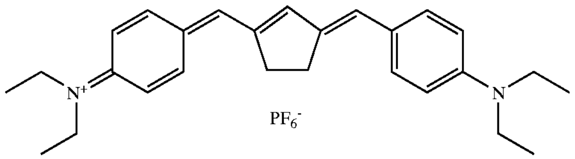

-continued

General formula (e)

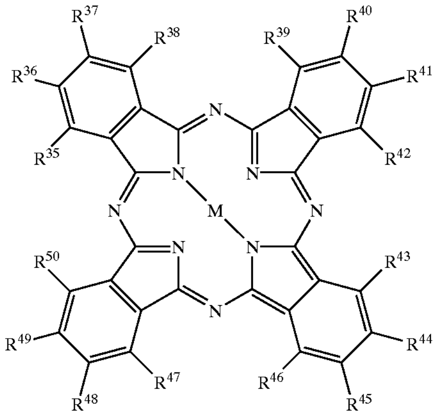

In the above-mentioned general formula (e), $R^{35}$ to $R^{50}$ each independently represents a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group or an onium salt structure optionally having a substituent. M represents a pair of hydrogen atoms, a metal atom, or a halometal group or oxymetal group. Examples of the metal atom contained therein include, in the periodic table, IA, IIA, IIIB and IVB group elements, first, second and third period transition metals and lanthanoid elements are listed. Among these, copper, magnesium, iron, zinc, cobalt, aluminum, titanium and vanadium are preferable.

Specific examples of the dyes of the general formula (e) which can be suitably used in the present invention include those listed below.

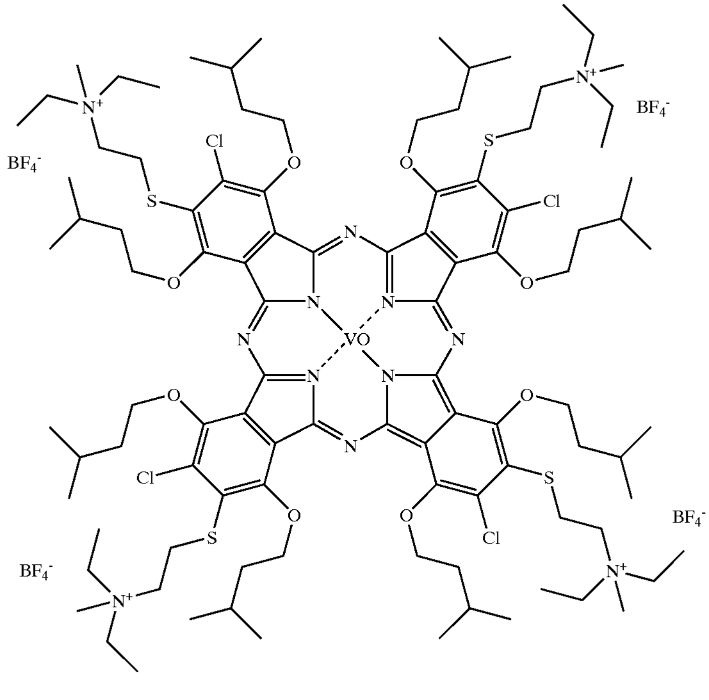

-continued

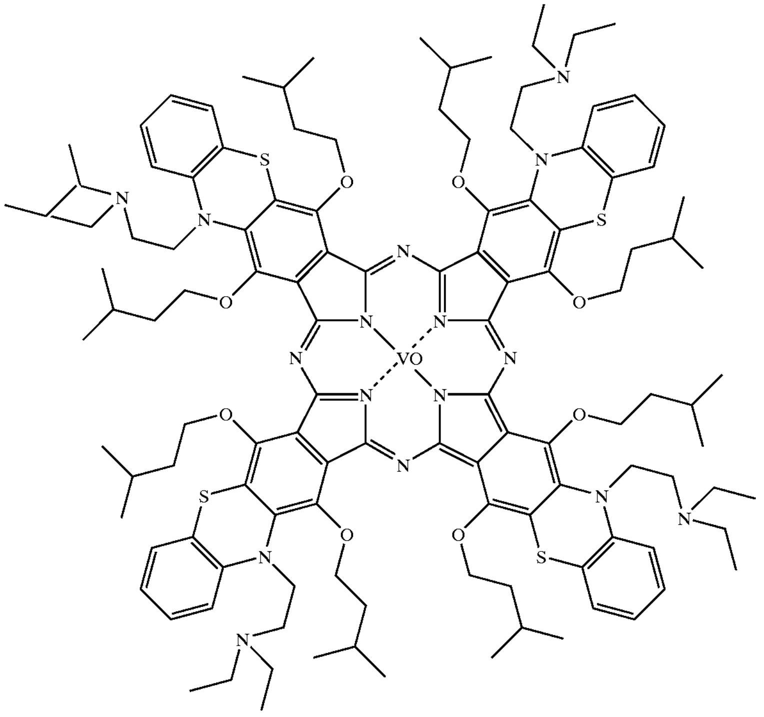

Examples of the dyes used as the light to heat converting agent in the present invention, include commercially available pigments and pigments described in "Color Index (C. I.) Handbook", Nippon ganryou gijutsu kyoukai ed., "Saishin ganryou binran" (Current Pigment Handbook) 1977, "Saishin ganryou ouyou gijutsu" (Current Pigment Application Technology), CMC, 1986 and "Insatsu inki gijutsu" (Current Pigment Application Technology), CMC, 1984.

Examples of the pigments usable in the present invention include a black pigment, yellow pigment, orange pigment, brown pigment, red pigment, violet pigment, blue pigment, green pigment, fluorescent pigment, metal powder pigment, and additionally, polymer bonding dye. Specific examples thereof include insoluble azo pigment, azolake pigment, condensed azo pigment, chelate azo pigment, phthalocyanine-based pigment, anthraquinone-based pigment, perylene and perynone-based pigment, thioindigo-based pigment, quinacridone-based pigment, dioxazine-based pigment, isoindolinone-based pigment, quinophthalone-based pigment, dyeing lake pigment, azine pigment, nitroso pigment, nitro pigment, natural pigment, fluorescent pigment, inorganic pigment and carbon black. Of these pigments, carbon black is preferable.

These pigments may be used without performing surface treatment, or the surface treatment may be performed before the pigments are used. As the surface treatment method, a method of coating a resin or wax on the surface of a pigment, a method of adhering a surfactant, a method of bonding a reactive substance (for example, a silane coupling agent, an epoxy compound, a polyisocyanate and the like) to the surface of a pigment, and the like may be used. The above-mentioned surface treatment methods are described in "Kinzoku sekken no seishitsu to Ouyou" ("Properties of Metallic Soaps and their Applications") (Saiwai Shobou), "Insatsu Inki Gijutsu" ("Printing Ink Technology"), CMC, 1984, and "Saishin ganryou ouyou gijutsu" ("Current Pigment Application Technology"), CMC, 1986.

The particle diameter of the pigment is within the range of preferably from 0.01 μm to 10 μm, more preferably from 0.05 μm to 1 μm, and most preferably from 0.1 μm to 1 μm. When the particle diameter of the pigment is less than 0.01 μm, the stability of a material dispersed in the application solution for the recording layer is not preferable, and when the particle diameter is over 10 μm, uniformity of the recording layer is not preferable.

As the method of dispersing a pigment, known dispersing technologies used to produce ink, toner and the like can be used. Examples of the dispersing machine include an ultrasonic disperser, a sand mill, attriter, a pearl mill, a super mill, a ball mill, an impeller, a disperser, a KD mill, a colloid mill, a dynatron, a three roll mill, and a press kneader. The details thereof are described in "Saishin ganryou Ouyou gijutsu" ("Current Pigment Application Technology"), CMC, 1986.

When these pigments or dyes are added, they are added in an amount of from 0.01 to 50% by weight, and preferably from 0.1 to 10% by weight. In the case of a dye, a particularly preferably amount is from 0.5 to 10% by weight and in the case of a pigment, a particularly preferably amount is from 0.1 to 10% by weight, based on the total weight of all solid components constituting the positive recording layer. When the addition amount of the pigment or dye added is less than 0.01% by weight, an effect of improving sensitivity lowers, and when this amount is over 50% by weight, the uniformity of the recording layer is lost, and durability thereof deteriorates.

Other Components

In the positive recording layer used in the first aspect and the second aspect of the present invention, various additives can be added if necessary. In the case of the second aspect, various additives may be contained only in the heat sensitive layer or the lower layer, or may be contained in both layers. For example, it is preferable that a substance which is thermally decomposable and substantially decreases the solubility of the alkaline water-soluble polymer compound when the substance is not decomposed is used in combination in order to improve the inhibition property with respect to dissolution of the image portion into the developer. Examples thereof include an onium salt, an o-quinone diazide compound, an aromatic sulfone compound, an aromatic sulfonate compound. Examples of the onium salt include diazonium salts, ammonium salts, phosphonium salts, iodonium salts, sulfonium salts, selenoium salts, and arsonium salts.

Suitable examples of the onium salt used in the present invention include diazonium salts described in S. I. Schlesinger, "Photogr. Sci. Eng.", 18 (1974), 387, T. S. Bal et al., "Polymer", 21 (1980), 423 and JP-A No. 5-158230, ammonium salts described in U.S. Pat. Nos. 4,069,055 and 4,069,056, and JP-A No. 3-140140, phosphonium salts described in D. C. Necker et al., "Macromolecules", 17 (1984), 2468, C. S. Wen et al, "Teh, Proc. Conf. Rad. Curing ASIA", Tokyo, October (1988), p. 478, and U.S. Pat. Nos. 4,069,055 and 4,069,056, iodonium salts described in J. V. Crivello et al ., "Macromolecules", 10(6), (1977) 1307, "Chem. & Eng. News", Nov. 28 (1988), p. 31, EP No. 104, 143, U.S. Pat. Nos. 339,049 and 410,201, and JP-A Nos. 2-150848 and 2-296514, sulfonium salts described in J. V. Crivello et al, "Polymer J." 17 (1985), 73, J. V. Crivello et al, "J. Org. Chem.", 43 (1978), 3055, W. R. Watt et al, "J. Polymer Sci.", "Polymer Chem. Ed.", 22 (1984), 1789, J. V. Crivello et al, "J. Polymer Bull.", 14 (1985), 279, J. V. Crivello et al, "Macromolecules", 14(5) (1981), 1141, J. V. Crivello et al, "Polymer Sci.", "Polymer Chem. Ed.", 17 (1979), 2877, EP Nos. 370,693, 233,567, 297,443 and 297,442, U.S. Pat. Nos. 4,933,377, 3,902,114, 410,201, 339,049, 4,760,013, 4,734,444 and 2,833,827, DE No. 2,904,626, 3,604,580 and 3,604,581, selenonium salts described in J. V. Crivello et al, "Macromolecules", 10(6) (1977), 1307, and J. V. Crivello et al, "J. Polymer Sci.", "Polymer Chem. Ed.", 17 (1979), 1047, arsonium salts described in C. S. Wen et al, "Teh, Proc. Conf. Rad. Curing ASIA", p. 478 Tokyo, October (1988), and the like.

Among onium salts, diazonium salts are particularly preferable. Particularly suitable diazonium salts are those described in JP-A 5-158230.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzensulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, p-toluenesulfonic acid and the. Of them, hexafluorophosphoric acid, and alkylaromatic sulfonic acids such as triisopropylnaphthlenesulfonic acid and 2,5-dimethylbenzenesulfonic acid are particularly suitable.

o-quinonediazide compounds are listed as the suitable quinonediazides. The o-quinonediazide compound used in the present invention is a compound having at least one o-quinonediazide group and increasing alkali-solubility by thermal decomposition thereof, and o-quinonediazide compounds of various structures can be used. o-quinonediazide helps the dissolution of a sensitive material system by an effect of losing the ability of suppressing dissolution of a binder by thermal decomposition thereof and an effect of changing the o-quinonediazide itself into an alkali-soluble substance. Examples of the o-quinonediazide compound usable in the present invention include compounds described in J. Coser "Light-sensitive Systems", John Wiley & Sons. Inc., pp. 339 to 352, and particularly suitable are sulfonates or sulfonamides of o-quinonediazide obtained by reacting with various aromatic polyhydroxy compounds or aromatic amino compounds. Further, esters of benzoquinone-(1,2)-diazidesulfonyl chloride or naphthoquinone-(1,2)-diazide-5-sulfonyl chloride with a pyrogallol-acetone resin as described in JP-B No. 43-28403, and esters of benzoquinone-(1,2)-diazidesulfonyl chloride or naphthoquinone-(1,2) -diazide-5-sulfonyl chloride with a phenol-formaldehyde resin as described in U.S. Pat. Nos. 3,046,120 and 3,188,210, can also be suitably used.

Further, esters of naphthoquinone-(1,2)-diazide-4-sulfonyl chloride with a phenol-formaldehyde resin or cresol-formaldehyde resin, and an ester of naphthoquinone-(1,2)-diazide-4-sulfonyl chloride with a pyrogallol-acetone resin can also be suitably used. Other useful o-quinonediazide compounds are reported and known in a number of patents. For example, o-quinonediazide compounds are described in respective specifications of JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, U.K. Patent Nos. 1,227,602, 1,251,345, 1,267,005, 1,329,888 and 1,330,932, DE No. 854,890, and the like.

An addition amount of the o-quinonediazide compound to be added is preferably from 1 to 50% by weight, further preferably from 5 to 30% by weight, and particularly preferably from 10 to 30% by weight, based on the total solid content of the printing plate material. These compounds can be used singly or in combination of two or more.

An amount of additives other than the o-quinonediazide compound is preferably from 1 to 50% by weight, further preferably from 5 to 30% by weight, and particularly preferably from 10 to 30% by weight, based on the total solid content of the printing plate material. It is preferable that the additives and the binders used in the present invention are contained in the same layer.

For the purpose of further improving sensitivity of the precursor, cyclic acid anhydrides, phenols and organic acids can also be used in combination. Examples of the cyclic acid anhydride include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, pyromellitic anhydride described in U.S. Pat. No. 4,115,128. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Further, examples of the organic acids include sulfonic acids, sulfinic acids, alkylsulfuric acids, phosphonic acids, phosphates, and carboxylic acids described in JP-A No. 2-96755. Specific examples thereof include p-toluenesulfonic acid, dodecylbenzenesulfonic acid, p-toluenesulfinic acid, ethylsulfuric acid, phenylphosphonic acid, phenylphophinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The proportion of the above-mentioned cyclic acid anhydrides, phenols and organic acids in a printing plate material (which proportion excludes the support) is preferably from 0.05 to 20% by weight, more preferably from 0.1 to 15% by weight, and particularly preferably from 0.1 to 10% by weight.

Further, in order to increase the stability of treatment of the precursor against development conditions, nonionic surfactants as described in JP-A Nos. 62-251740 and 3-208514, amphoteric surfactants as described in JP-A Nos. 59-121044 and 4-13149, siloxane-based compounds as described in EP 950517, and monomer copolymers containing fluorine as described in JP-A No. 11-288093 can be added into the application solution for the recording layer of the present invention.

Specific examples of the nonionic surfactant include sorbitan tristearate, sorbitan monopalmitate, sorbitan trioleate, stearic monoglyceride, polyoxyethylene nonylphenyl ether and the like. Specific examples of the amphoteric surfactanc include alkyldi(aminoethyl)glycine, alkylpolyaminoethylglycine hydrochloride, 2-alkyl-N-carboxyethyl-N-hydroxyethyl imidazolynium betaine, N-tetradecyl-N,N-betaine type surfactant (for example, trade name: Amogen K, manufactured by Dai-ichi Kogyo Corporation.) and the like.

As the siloxane-based compound, a block copolymer of dimethylsiloxane and polyalkylene oxide is preferable, and specific examples thereof include polyalkylene oxide-modified silicones such as DBE-224, DBE-621, DBE-712, DBP-732 and DBP-534 manufactured by Chisso Corporation, Tego Glide 100 and the like manufactured by Tego Corporation (Germany).

The proportion of the above-mentioned nonionic surfactants and amphoteric surfactants in a printing plate material is preferably from 0.05 to 15% by weight, more preferably from 0.1 to 5% by weight.

In the recording layer of the present invention, a printing-out agent for obtaining a visible image directly after heating by exposure, and a dye or pigment as an image coloring agent, can be added.

Typical examples of the printing-out agent are combinations of compounds releasing an acid due to heating by exposure (light acid releasing agent) and organic dyes capable of forming a salt. Specific examples of the combination include a combination of o-naphthoquinonediazide-4-sulfonyl halide and a salt-forming organic dye described in JP-A Nos. 50-36209 and 53-8128, and a combination of a trihalomethyl compound and a salt-forming organic dye described in JP-A Nos. 53-36223, 54-74728, 60-3626, 61-143748, 61-151644 and 63-58440. Examples of the trihalomethyl compound include oxazole-based compounds and triazine-based compounds, and any of these is excellent in stability over time and gives a clear print-out image.

As the image coloring agent, other dyes are also used other than the above-mentioned salt-forming organic dyes. Examples of the suitable dye include oil-soluble dyes and basic dyes and the salt-forming organic dyes. Specific examples thereof include Oil Yellow #101, Oil Yellow #103, Oil Pink #312, Oil green BG, Oil Blue BOS, Oil Blue #603, Oil Black BY, Oil Black BS, Oil Black T-505 (all of these are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000) and Methylene Blue (CI52015). Particularly preferable dyes are those described in JP-A No. 62-293247. These dyes can be added into a printing plate material in a proportion of from 0.01 to 10% by weight, and preferably from 0.1 to 3% by weight based on the total solid content of the printing plate material. Further, a plasticizer is added into a printing plate material used in the present invention to impart the flexibility of a film, and the like, if necessary. Examples of the plasticizer include oligomers and polymers and the like of butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, acrylic acid or methacrylic acid.

For the purpose of reinforcing discrimination of an image and reinforcing a resistance to scratches on the surface of the precursor, it is preferable to concurrently use a polymer containing as a polymerization component a (meth)arylate monomer having 2 or 3 perfluoroalkyl groups having 3 to 20 carbon atoms in the molecule. The compound may be contained in any of a lower layer and a heat sensitive layer, and it is more effective to allow the compound to be contained in the heat sensitive layer provided at an upper position.

An amount of the compound to be added is preferably from 0.1 to 10% by weight and more preferably from 0.5 to 5% by weight in terms of a proportion thereof in a material forming a layer.

Into the materials of the planographic printing plate precursor of the present invention, a compound that decreases a static friction coefficient of the surface of the precursor can also be added for the purpose of imparting a resistance against scratches. Specifically, esters of long chain alkylcarboxylic acids and the like as used in U.S. Pat. No. 6,117,913 are listed as examples. Such a compound may be contained in any of a lower layer and a heat sensitive layer of the precursor. However, it is more effective to allow the compound to be contained in the heat sensitive layer provided at an upper position. An amount of this compound to be added is preferably from 0.1 to 10% by weight and more preferably from 0.5 to 5% by weight with respect to total materials forming a layer.

Into a lower layer or a heat sensitive layer in the present invention, lower molecular weight compounds having an acidic group may be contained, if necessary.

As the above-mentioned acidic group, sulfonic acid group, carboxylic acid group and phosphoric acid group are listed as examples. Of them, compounds having a sulfonic acid group are preferable. Specific examples include aromatic sulfonic acids or aliphatic sulfonic acids such as p-toluenesulfonic acid and naphthalenesulfonic acid.

This kind of a lower molecular weight compound may be contained in any of a lower layer and a heat sensitive layer. An amount of this compound to be added is preferably from 0.05 to 5% by weight, and more preferably from 0.1 to 3% by weight with respect to the total amount of materials forming the layer. When the amount thereof added is over 5% by weight, the solubility of each layer in a developer increases, which is undesirable.

In the second aspect of the present invention, various dissolution-suppressing agents may be contained lower layer and/or a heat sensitive layer for the purpose of controlling the solubility of a lower layer and/or a heat sensitive layer.

As the above-mentioned dissolution suppressing agent, disulfone compounds or sulfone compounds described in JP-A No. 11-119418 are suitably used, and specifically, 4,4'-bishydroxyphenylsulfone is preferably used.

The dissolution-suppressing agent may be contained in any of a lower layer and a heat sensitive layer. An amount of this compound to be added is preferably from 0.05 to 20% by weight, and more preferably from 0.5 to 10% by weight with respect to the total amount of materials forming the layer.

Method of Producing Planographic Printing Plate Precursor

Usually, the positive planographic printing plate precursor of the present invention is produced by providing a positive recording layer (heat sensitive layer and lower layer, in the case of the second aspect) on the above-mentioned support having a hydrophilic surface, by applying a solution prepared by dissolving the above-mentioned components in a solvent.

Usable examples of the solvent include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrolidone, dimethyl sulfoxide, sulfolane, γ-butyrolactone and toluene. These solvents are used singly or in combinations of two or more.

In the second aspect, a solvent used for application which has different solubilities for the alkali-soluble polymer used in the heat sensitive layer and the alkali-soluble polymer used in the lower layer, is preferably selected. Namely, when a lower layer is applied before the application of the upper layer which is a heat sensitive layer adjacent to the lower layer, if a solvent capable of dissolving an alkali-soluble polymer in the lower layer is used as the application solvent for the uppermost layer, mixing at the interface of the layers cannot be ignored, and in the extreme case, instead of a multi-layer structure, a uniform single layer might be obtained. When a mixing occurs at the interface of two adjacent layers or two layers are mutually dissolved to form a uniform layer are, the effect of the second aspect of the present invention may be caused to deteriorate by the presence of two layers. Therefore, it is desirable that a solvent used for applying a heat sensitive layer provided as the upper layer has a poor solubility with respect to the alkali-soluble polymer contained in the lower layer.

The concentration of components used for forming the layer(s) (total solid content including additives) in a solvent is preferably from 1 to 50% by weight.

The application amount (solid content) provided on a support and obtained after application and drying differs depending on an intended use thereof. In the case of the first aspect, the application amount is preferably from 0.5 to 5.0 $g/m^2$, in general. When the application amount is reduced, the apparent sensitivity increases while the film property of a photosensitive film decreases.

In the case of the second aspect, the application amount of the heat sensitive layer is preferably from 0.05 to 1.0 $g/m^2$ and the application amount of the lower layer preferably from 0.3 to 3.0 $g/m^2$. When the application amount of the heat sensitive layer is less than 0.05 $g/m^2$, a decrease in the image forming property might occur, and when over 1.0 $g/m^2$, a decrease in sensitivity might occur. When the application amount of the lower layer is too small or too large and out of the above-mentioned range, the image forming property tends to decrease. The total application amount of the above-mentioned two layers is preferably from 0.5 to 3.0 $g/m^2$. When the application amount is less than 0.5 $g/m^2$, the film property tends to decrease, when over 3.0 $g/m^2$, sensitivity thereof tends to decrease. Namely, when the application amount is reduced, the apparent sensitivity increases while the film property of the heat sensitive layer film decreases.

As the application method, various methods can be used, for example, bar coater coating, rotation coating, spray coating, curtain coating, dip coating, air knife coating, blade coating, roll coating and the like.

Into the photosensitive layer in the present invention, surfactants for improving a coating ability, such as fluorine containing surfactants as described in JP-A No. 62-170950 can be added. A preferable amount of these surfactants to be added is from 0.01 to 1% by weight, further preferably from 0.05 to 0.5% by weight based on the total solid content in the layer.

(Plate Making and Printing)

The planographic printing plate precursor of the present invention is used for printing usually after image-wise exposure and development treatment.

Image Formation

An image is formed by heat or light.

Examples of the light source of active beam used for image-wise exposure include a mercury lamp, a metal halide lamp, a xenon lamp, a chemical lamp, and a carbon arc. As the radiation, an electron beam, X rays, an ion beam, far infrared rays and the like can be used. Moreover, g-line, i-line, Deep-UV light and high density energy beam (laser beam) can also be used. Examples of the laser beam include a helium neon laser, an argon laser, a krypton laser, a helium cadmium laser, and a KrF excimer laser. Specifically, direct image-wise recording by a thermal recording head and the like, scanning exposure by infrared laser, high illumination flash exposure by a xenon discharge lamp and the like, infrared lamp exposure, and the like are used. In the present invention, light sources emitting light having wavelength in the range from near infrared ray to infrared ray are preferable, and solid laser and semiconductor laser are particularly preferable. Therefore, exposure by solid high output infrared lasers such as semiconductor laser, YAG laser and the like, which can emit infrared rays having a wavelength of from 700 to 1200 nm, and the like are suitable.

Developer

As the developer and replenisher used for the planographic printing plate precursor of the present invention, conventionally known alkaline aqueous solutions can be used.

Examples of the content of the solution include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium borate, potassium borate, ammonium borate, sodium hydroxide, ammonium hydroxide, potassium hydroxide, lithium hydroxide and the like, and sodium carbonate, potassium carbonate, ammonium carbonate, sodium hydrogen carbonate, potassium hydrogen carbonate, ammonium hydrogen carbonate, potassium citrate, tripotassium citrate, and sodium citrate. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also used. These alkali agents are used alone or in combination of two or more.

The developer includes a so-called "silicate developer" using an alkali silicate and containing silicon dioxide, and a "non-silicate developer" comprising a non-reducing sugar and a base and containing substantially no silicon dioxide. Here, the term "substantially" means allowance of the presence of inevitable impurities and a trace amount of silicon dioxide as a by-product. In the first aspect, the particularly preferable developer among these alkali agents is an aqueous solution of silicate such as sodium silicate, potassium silicate and the like. The reason for this is that control of developing property is possible depending on the concentrations and ratio of silicon oxide ($SiO^2$) and alkali metal oxide ($M_2O$) (wherein, M represents an alkali metal or ammonium group). For example, alkali metal silicates as described in JP-A No. 54-62004 and JP-B No. 57-7427 are effectively used.

In the development process for an image forming material of the second aspect of the present invention, any of the above-mentioned developers can be applied, and from the standpoint of suppressing the generation of scratches, it is preferable to use a non-silicate developer. In the second aspect, the above-mentioned alkali aqueous solutions having a pH of from 12.5 to 13.5 are particularly preferable.

A "silicate developer" will be first described hereinafter. The above-mentioned alkali silicate shows an alkaline property when dissolved in water, and for example, alkali metal silicates such as sodium silicate, potassium silicate, lithium silicate and the like, and ammonium silicate and the like are listed.

The above-mentioned alkali silicate may be used alone or in combinations of two or more.

Of the above-mentioned alkali aqueous solutions, those containing silicon oxide ($SiO^2$) and alkali oxide ($M_2O$) in a mixing ratio ($SiO_2/M_2O$: molar ratio) of from 0.5 to 3.0 are preferable, and those having a mixing ration of from 1.0 to 2.0 are more preferable.

When the above-mentioned ratio ($SiO_2/M_2O$) is less than 0.5, alkali strength increases, consequently, a problem occurs such as etching of the aluminum plate and the like which are generally used as a substrate for the planographic printing plate precursor. When the ratio is over 3.0, the developing property may decrease.

The concentration of an alkali silicate in a developer is preferably from 1 to 10% by mass, more preferably from 3 to 8% by mass, and most preferably from 4 to 7% by mass based on the weight of an alkali aqueous solution.

When the concentration of the above-mentioned alkali silicate is less than 1% by mass, developing property and treating ability may decrease. When over 10% by mass, precipitation and crystallization tend to be formed, and further, gelling tends to occur in neutralization of the waste liquid discharge, leading to a problem on liquid discharge treatment.

Next, "non-silicate developer" will be described below. This developer comprises a non-reducing sugar and a base as described above. Here, the non-reducing sugar means saccharides having no reducing property due to the absence of a free type aldehyde group and ketone group. The non-reducing sugar is classified into trehalose type oligosaccharides in which reducing groups are mutually bonded, glycosides in which reducing groups of saccharides and non-saccharides are bonded, and sugar alcohols reduced by hydrogenating saccharides. In the present invention, any of these can be suitably used.

Examples of the above-mentioned trehalose type oligosaccharides include saccharose and trehalose, and examples of the above-mentioned glycoside include alkyl glycosides, phenol glycosides, and mustard oil glycoside.

Examples of the above-mentioned sugar alcohols include D,L-arabitol, ribitol, xylitol, D,L-sorbitol, D,L-annitol, D,L-iditol, D,L-talitol, and dulcitol, allodulcitol.

Further, suitable examples include multitol obtained by hydrogenation of disaccharides, and reduced materials obtained by hydrogenation of oligosaccharide (reduced starch sirup).

As the non-reducing sugar, of the above-mentioned saccharides, sugar alcohol and saccharose are preferable, and particularly, D-sorbitol, saccharose and reduced starch syrup are more preferable since they have a buffering action in a suitable pH range.

These non-reducing sugars may be used alone or in combinations of two or more, and the proportion in a developer is preferably from 0.1 to 30% by mass, and more preferably from 1 to 20% by mass.

Among the above-mentioned alkali agents, sodium hydroxide and potassium hydroxide are preferable because pH control is possible in a wider pH range by controlling the addition amount of the alkali agent to non-reducing sugars.

Also, trisodium phosphate, tripotassium phosphate, sodium carbonate, potassium carbonate and the like are preferable since they themselves have a buffering action.

Treatment Method

It is known that, in the case of development using an automatic developing machine, a lot of PS plates can be treated without changing a developer in a developing tank for a long period of time by adding to the developer an aqueous solution (replenisher) having higher alkali strength than that of the developer. Also in the present invention, this replenishing method is preferably applied. Into the developer and replenisher, various surfactants and organic solvents can be added, if necessary, for the purpose of promoting and suppressing the developing property, dispersing development scum, and enhancing ink affinity of the image portion of the plate.

Examples of preferable surfactants include anionic, cationic, nonionic and amphoteric surfactants. Further, reducing agents such as hydroquinone, resorcinol, sodium salts and potassium salts of inorganic acids such as sulfurous acid, hydrosulfurous acid and the like, and organic carboxylic acids, defoaming agents, and hard water-softening agents can also be added into a developer and replenisher.

The printing plate developed using the above-mentioned developer and replenisher is post-treated with washing water, a rinse solution containing a surfactant and the like, and a de-sensitizing solution containing gum arabic, starch derivatives and the like. As the post treatment for the positive planographic printing plate of the present invention, these treatments can be used in various combinations.

Recently, in plate making and printing fields, automatic developing machines for printing plates are widely used for rationalization and standardization of plate making work. This automatic developing machine is generally composed of a developing part and a post-treatment part, and composed of an apparatus for carrying a printing plate, processing solution vessels and a spray apparatus. It performs development treatment by spraying from a spray nozzle a processing solution, which was pumped up, while carrying an exposed printing plate horizontally. Recently, there is also known a method in which treatment is effected by immersing and transporting a printing plate within a processing solution vessel filled with a processing solution by an under-solution guide roll and the like. In this automatic treatment, treatment can be effected by supplying a replenisher into a treating solution depending on the treatment amount, operation time and the like. Also applicable is a so-called disposable treatment method in which treatment is conducted with a substantially unused treating solution.

In the positive planographic printing plate precursor of the present invention, when a planographic printing plate obtained by image-wise exposure, development, water-washing and/or rinsing and/or gumming has an unnecessary image portion (for example, film edge mark of original image film), this unnecessary image portion is deleted. This deletion is preferably conducted by a method in which a deletion solution, which is described in JP-B No. 2-13293, is applied on an unnecessary image portion, left for a predetermined time, then, washed with water. Also utilized method is a method in which an unnecessary image portion is irradiated with an active beam introduced by an optical filer, and then developed, as described in JP-A No. 59-174842.

A planographic printing plate obtained as described above can be subjected to a printing process after application of a de-sensitizing gum, if necessary. However, when a planographic printing plate having further higher printing resistance is desired, burning treatment is performed. When a planographic printing plate is subjected to burning, it is preferable to treat the plate with a surface adjusting solution as described in JP-B Nos. 61-2518, 55-28062, 62-31859 and 61-159655 before the burning.

As this method, application of the surface adjusting solution can be conducted such that the surface adjusting solution is applied to the planographic printing plate by a sponge or absorbent cotton impregnated with the surface adjusting solution, by immersing the printing plate into a vat filled with the surface adjusting solution, or by an automatic coater. After application, the coated amount can be made uniform by a squeegee or squeegee roller, to give a preferably effect.

A suitable application amount of the surface adjusting solution is suitably from 0.03 to 0.8 g/m$^2$ (dry weight), in general. A planographic printing plate applied with the surface adjusting solution is dried if necessary, then, heated to higher temperatures by a burning processor (for example, burning processor sold by Fuji Photo Film Co., Ltd., "BP-1300") and the like. The heating temperature and time in this case are preferably 180 to 300° C. and 1 to 20 minutes, respectively, though they depend on the kinds of components forming the image.

The burning-treated planographic printing plate can be appropriately subjected, if necessary, to conventionally effected treatments such as water-washing, gumming and the like. However, when a surface adjusting solution containing a water-soluble polymer compound and the like is used, so-called de-sensitizing treatments such as gumming and the like can be omitted. The planographic printing plate obtained by such treatments is set in an offset printing printer and the like, and used to obtain a large number of prints.

EXAMPLES

The first aspect of the present invention will be described in accordance with the following examples, but the scope of the present invention is not limited thereto.

Examples of First Aspect

Example 1

Production of Support Having Hydrophilic Surface Formation of Intermediate Layer On a PET film (M4100, manufactured by Toyobo Co., Ltd.) having film thickness of 0.188 mm, the following photopolymerizable composition was applied by using a rod bar No. 17, and dried at 80° C. for 2 seconds. Then, this applied surface was irradiated with light for 10 minutes using a 400 W high pressure mercury lamp (UVL-400P, manufactured by Riko Kagaku Sangyo Corporation), to pre-harden the composition.

Photopolymerizable Composition

| | |
|---|---|
| Allyl methacrylate/methacrylic acid copolymer (molar ratio: 80/20, molecular weight: 100,000) | 4 g |
| Ethylene oxide-modified bisphenol A diacrylate (M210, manufactured by Toagosei Co., Ltd.) | 4 g |
| 1-Hydroxycyclohexyl phenyl ketone | 1.6 g |
| 1-Methoxy-2-propanol | 16 g |

Formation Hydrophilic Surface

The film on which the intermediate film had been formed was immersed into an aqueous solution of monomer containing 10% by weight of sodium styrenesulfonate and 0.01% by weight of sodium hypochlorite, and irradiated under an argon atmosphere for 30 minutes using a 400 W high pressure mercury lamp. The film obtained after irradiation was washed with ion exchanged water, to obtain a hydrophilic surface in which sodium styrenesulfonate had been grafted. As a result, a PET film support having a hydrophilic surface in Example 1 was obtained.

Formation of Recording Layer

On the resulted support, the following application solution for recording layer was applied at an application amount of 1.0 g/m$^2$, then, dried at 140° C. for 50 seconds in a Perfect Oven PH200, which is manufactured by TABAI Corporation, such that a scale of a Wind Control thereof is set at 7, to form a recording layer. In this way, a positive planographic printing plate precursor 1 in Example 1 was produced.

(Application Solution for Recording Layer)

| | |
|---|---|
| N-(4-aminosulfonylphenyl)methacrylamide/acrylonitrile/methyl methacrylate (35/35/30: weight average molecular weight: 50,000) | 1.896 g |
| Novolak resin (SUMILIGHTE RESIN PR54020, manufactured by Sumitomo Dulles Co., Ltd.) | 0.332 g |
| Cyanine dye A (having a structure that is shown below) | 0.155 g |
| 4,4'-bishydroxyphenylsulfone | 0.063 g |
| Tetrahydrophthalic anhydride | 0.190 g |
| p-toluenesulfonic acid | 0.008 g |
| Ethyl Violet in which a counter ion had been substituted by 6-hydroxynaphthalenesulfonic acid | 0.05 g |
| Fluorine-containing surfactant (Megafac F176, manufactured by Dainippon Ink & Chemicals Inc.) | 0.145 g |
| Fluorine-containing surfactant (Megafac MCF-312 (30%), manufactured by Dainippon Ink & Chemicals Inc.) | 0.120 g |
| Methyl ethyl ketone | 26.6 g |
| 1-Methoxy-2-propanol | 13.6 g |
| γ-Butyrolactone | 13.8 g |

Cyanine dye A

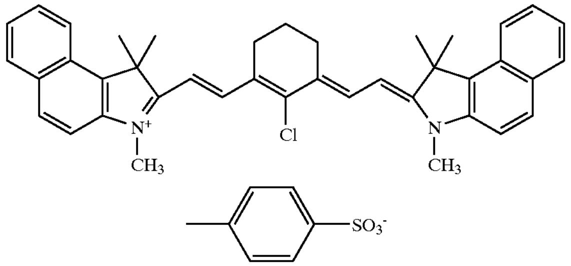

Evaluation of Planographic Printing Plate Precursor

The resulted positive planographic printing plate precursor 1 of the present invention was subjected to exposure, development and printing according to the following methods, and the blemish property of the print obtained with the plate was evaluated.

Test patterns were formed on the positive planographic printing plate precursor 1 by using a Trend Setter manufactured by Creo Corporation at a beam strength of 9 W and a drum rotation speed of 150 rpm. Then, the plate was developed for 12 seconds, using PS processor 900H manufactured by Fuji Photo Film Co., Ltd. charged with a developer DT-1 (diluted at 1:8) manufactured by Fuji Photo Film Co., Ltd. and a finisher FP2W (diluted at 1:1) manufactured by Fuji Photo Film Co., Ltd., while maintaining the liquid temperature at 30° C. The electric conductivity of the developer was 45 mS/cm at this point.

Then the developed planographic printing plate 1 was set in a printer (trade name: RYOUBI 3200, manufactured by Ryoubi Magics K. K.) and printing was conducted. IF 201 (2.5%) and IF 202 (0.75%) (manufactured by Fuji Photo Film Co., Ltd.) were used as wetting water, and GEOS-G Japanese ink (manufactured by Dainippon Ink & Chemicals Inc.) was used as the ink.

As a result of the printing which was conducted by using the positive planographic printing plate precursor 1 of the present invention, a print of high image quality showing few blemish properties was obtained. Thereafter, printing was repeated continuously, and excellent prints having no blemishes at non-image portions were obtained even after 9,000 sheets of paper were printed by using the planographic printing plate precursor 1 of the present invention. As a result, the plate was also found to maintain excellent hydrophilicity.

Example 2

A support having a hydrophilic surface in which acrylic acid had been grafted was obtained in the same manner as in Example 1 except that acrylic acid was used instead of the sodium styrenesulfonate. Then, a recording layer was formed on this support by the same manner as in Example 1, to produce a positive planographic printing plate precursor 2 of Example 2.

Example 3

A support having a hydrophilic surface in which acrylamide had been grafted was obtained in the same manner as in Example 1 except that acrylamide was used instead of the sodium styrenesulfonate. Then, the recording layer was formed on this support by the same manner as in Example 1, to produce a positive planographic printing plate precursor 3 of Example 3.

Evaluation of Planographic Printing Plate Precursor

The resulting positive planographic printing plate precursors 2 and 3 of the present invention were subjected to exposure, development and printing under the same conditions as in Example 1, and the blemish properties of the resulting print(s) were evaluated.

As a result of the printing in which the positive planographic printing plate precursors 2 and 3 of the present invention were used, a print of high image quality showing low polluting property was obtained. Thereafter, printing was repeated continuously, excellent prints having no blemishes at non-image portions were obtained even after 11,000 sheets of paper were printed using the planographic printing plate precursor 2 and 13,000 sheets of paper were printed using the planographic printing plate precursor 3. As a result, the plates were also found to maintain excellent hydrophilicity.

Namely, an effect was shown that the positive planographic printing plate precursors of the first aspect of the present invention manifest improved print polluting property and can form a high quality image showing no pollution.

The second aspect of the present invention will be described in accordance with the following examples, but the scope of the present invention is not limited thereto.

Examples of Second Aspect

Example 4

Production of Planographic Printing Plate Precursor 4

The support having the hydrophilic surface was produced in the same manner as in Example 1.

Formation of Recording Layer

On the resultant support, the following application solution for lower layer was applied at an application amount of 0.85 g/m$^2$, and then dried at 140° C. for 50 seconds in the Perfect Oven PH200 manufactured by TABAI Corporation such that the scale of the Wind Control thereof is set at 7. Then, the application solution for heat sensitive layer was applied at the application amount of 0.15 g/m$^2$, and dried at 120° C. for 1 minute, to form a recording layer. As the result, the planographic printing plate precursor 4 of this example was obtained.

| Application solution for recording layer | |
|---|---|
| N-(4-aminosulfonylphenyl)methacrylamide/acrylonitrile/methyl methacrylate (36/34/30: weight average molecular weight: 50,000) | 1.896 g |
| Cresol novolak resin (m/p = 6/4, weight average molecular weight: 4500, monomer residual amount: 0.8% by weight) | 0.237 g |
| Cyanine dye A | 0.109 g |
| 4,4'-bishydroxyphenylsulfone | 0.063 g |
| Tetrahydrophthalic anhydride | 0.190 g |
| p-toluenesulfonic acid | 0.008 g |
| Ethyl Violet in which counter ion had been substituted by 6-hydroxynaphthalenesulfonic acid | 0.05 g |
| Fluorine-containing surfactant (Megafac F176, manufactured by Dainippon Ink & Chemicals Inc.) | 0.035 g |
| Methyl ethyl ketone | 26.6 g |
| 1-Methoxy-2-propanol | 13.6 g |
| γ-Butyrolactone | 13.8 g |
| **Application solution for heat sensitive layer** | |
| m,p-Cresol novolak (m/p ratio = 6/4, weight average molecular weight: 4500, unreacted cresol content: 0.8% by mass) | 0.237 g |
| Cyanine dye A (having the above-mentioned structure) | 0.047 g |
| Dodecyl stearate | 0.060 g |
| 3-Methoxy-4-diazodiphenylamine hexafluorophosphate | 0.030 g |
| Fluorine-containing surfactant (Megafac F176, manufactured by Dainippon Ink & Chemicals Inc.) | 0.110 g |
| Fluorine-containing surfactant (Megafac MCF-312 (30%), manufactured by Dainippon Ink & Chemicals Inc.) | 0.120 g |
| Methyl ethyl ketone | 15.1 g |
| 1-Methoxy-2-propanol | 7.7 g |

Example 5

Production of Planographic Printing Plate Precursor 5

The support having the hydrophilic surface to which acrylic acid had been grafted was obtained in the same manner as in Example 4 except that acrylic acid was used instead of the sodium styrenesulfonate. Then, a recording layer was formed on this support by the same manner as in Example 4, to produce a planographic printing plate precursor 5 (sample 2).

Example 6

Production of Planographic Printing Plate Precursor 6

The support having the hydrophilic surface to which acrylamide had been grafted was obtained in the same manner as in Example 4 except that acrylamide was used instead of the sodium styrenesulfonate. Then, the recording layer was formed on this support by the same manner as in Example 4, to produce the planographic printing plate precursor (sample 3).

Plate Making and Printing

The planographic printing plate precursors 4 to 6 obtained as described above were exposed by Trend Setter 3444VFS manufactured by Creo Corporation equipped with water cooling type 40 W infrared ray semiconductor laser, and then developed using the following developer (non-silicate developer). Then, the plates were set to a cylinder of a printer SOR-M manufactured by Heidelberg Corporation, and wetting water was fed. Then, ink was fed, further, paper was fed and printing was carried out.

Developer

A concentrated solution was prepared such that 20 g of an amphoteric surfactant PIONIN C-158G (manufactured by Takemoto Oil & Fat Co., Ltd.) and 2.0 g of a defoaming agent OLFIN AK-02 (manufactured by Nisshin Chemicals Co., Ltd.) were added to 1 liter of 45% by mass aqueous solution of a potassium salt in which a combination of a non-reducing sugar and a base is used, namely D-sorbitol/potassium oxide ($K_2O$) were comprised. This concentrated solution was diluted with water to be one ninth strength and provide a developer. This developer had an electric conductivity of 45 mS/cm.

Evaluation of Planographic Printing Plate Precursor

The planographic printing plate precursor was evaluated by sensitivity thereof in forming the image and the image quality of the printed image obtained.

Sensitivity was evaluated by measuring the exposure amount ($mJ/cm^2$) necessary to form the image on each printing plate. When the measured value is smaller, sensitivity is more excellent.

The image quality of the print was observed visually, to find that a high quality print having no blemishes at non-image portions was obtained. Further, the number of the prints having excellent image quality, which was obtained by exposure of the above-mentioned exposure amount and printing, was counted. The results are shown in Table 1.

TABLE 1

| | Sample No. | Sensitivity ($mJ/cm^2$) | Number of excellent image print obtained |
|---|---|---|---|
| Example 4 | 1 | 100 | 20,000 |
| Example 5 | 2 | 80 | 19,000 |
| Example 6 | 3 | 90 | 22,000 |

It was found from Table 1 that the planographic printing plate precursor of the present invention shows excellent sensitivity for forming the image, and can provide a lot of prints having high image quality and showing no blemishes or staining at non-image portions.

The positive planographic printing plate precursor of the second aspect of the present invention performed an effect that sensitivity for forming an image is excellent and an image of excellent image quality and showing no blemishes or stains at non-image portions can be formed.

What is claimed is:

1. A positive planographic printing plate precursor comprising:

a support including a substrate and a hydrophilic surface; and a recording layer disposed on said support and formed by providing a heat sensitive layer on a lower layer; wherein said hydrophilic surface includes a hydrophilic graft polymer which is directly bonded to the surface of the substrate, said lower layer includes a water-insoluble and alkali-soluble polymer compound, and said heat sensitive layer includes a water-insoluble and alkali-soluble polymer compound and a light to heat converting agent, and a solubility of said heat sensitive layer in an alkali aqueous solution is increased by an effect of at least one of light and heat.

2. The positive planographic printing plate precursor according to claim 1, wherein the polymer compound included in the heat sensitive layer comprises a polymer compound having a phenolic hydroxyl group.

3. The positive planographic printing plate precursor according to claim 1, wherein the polymer compound included in the lower layer comprises an acrylic resin.

4. The positive planographic printing plate precursor according to claim 1, wherein the hydrophilic graft polymer chain comprises polymer chains obtained by one of applying and applying and cross-linking at least one selected from the group consisting of (i) a polymer obtained by bonding a hydrophilic graft polymer chain to a trunk polymer compound, (ii) a polymer obtained by bonding a hydrophilic graft polymer chain to a trunk polymer compound and by introducing a cross-linkable functional group into the trunk polymer compound, and (iii) a composition including a cross-linking agent and a hydrophilic polymer having a cross-linking group on the polymer end.

5. The positive planographic printing plate precursor according to claim 1, wherein the hydrophilic graft polymer chain has a structure in which at least one end of the polymer chain is bonded to one of the surface of the substrate and a surface layer of the substrate, and a graft part showing hydrophilicity of the polymer chain is substantially not cross-linked.

6. The positive planographic printing plate precursor according to claim 1, wherein at least one of the water-insoluble and alkali-soluble polymer compounds comprises a polymer having at least one of a phenol group and a sulfonamide group in at least one of a main chain and a side chain thereof.

7. The positive planographic printing plate precursor according to claim 1, wherein the light to heat converting agent comprises at least one of infrared absorbing dyes and pigments having absorption maximums in a range of from 760 nm to 1200 nm.

8. A method for producing a positive planographic printing plate precursor, the method comprising the steps of:

disposing a hydrophilic surface, in which a hydrophilic graft polymer chain is present, on the substrate to form a support, and providing a recording layer, which includes a compound absorbing light and generating heat and a water-insoluble and alkali-soluble polymer compound, wherein solubility in an alkaline aqueous solution of the recording layer increases, by the effect of at least one of light and heat, wherein the step of providing the recording layer includes sub-steps of providing a lower layer containing a water-insoluble and alkali-soluble polymer compound on the support, and providing the recording layer on the lower layer.

9. A positive planographic printing plate precursor comprising:

a support including a substrate and a hydrophilic surface; and a positive recording layer disposed on said support, said positive recording layer including a light to heat converting agent, and a water-insoluble and alkali-soluble polymer compound, wherein, said hydrophilic surface includes a hydrophilic graft polymer chain and a solubility of said positive recording layer in an alkali aqueous solution is increased by exposure, and wherein, a lower layer containing a water-insoluble and alkali-soluble polymer compound is provided between said support and said positive recording layer.

* * * * *